United States Patent [19]

Hyuga et al.

[11] Patent Number: 5,406,098
[45] Date of Patent: Apr. 11, 1995

[54] SEMICONDUCTOR CIRCUIT DEVICE AND METHOD FOR PRODUCTION THEREOF

[75] Inventors: Fumiaki Hyuga, Tokyo; Kenji Shiojima, Isahara; Tatsuo Aoki, Hachioji; Kazuyoshi Asai, Atsugi; Masami Tokumitsu; Kazumi Nishimura, both of Isehara; Yasuro Yamane, Sagamihara, all of Japan

[73] Assignee: Nippon Telegraph & Telephone Corporation, Tokyo, Japan

[21] Appl. No.: 285,307

[22] Filed: Aug. 3, 1994

Related U.S. Application Data

[62] Division of Ser. No. 171,396, Dec. 22, 1993, Pat. No. 5,369,043.

[30] Foreign Application Priority Data

Dec. 25, 1992 [JP] Japan ................................ 4-358052
Jan. 4, 1993 [JP] Japan ................................ 5-014405

[51] Int. Cl.$^6$ .......................................... H01L 29/80
[52] U.S. Cl. .................................. 257/192; 257/280; 257/473
[58] Field of Search ................. 257/192, 280, 24, 27, 257/284, 473

[56] References Cited

U.S. PATENT DOCUMENTS

| | | | |
|---|---|---|---|
| 4,603,469 | 8/1986 | Armiento et al. | 257/280 |
| 5,101,245 | 3/1992 | Shimura | 257/192 |
| 5,124,770 | 6/1992 | Umemoto et al. | 257/280 |

FOREIGN PATENT DOCUMENTS

| | | | |
|---|---|---|---|
| 60-35577 | 2/1985 | Japan | 257/192 |
| 60-86872 | 5/1985 | Japan | . |
| 61-290774 | 12/1986 | Japan | 257/192 |
| 62-158365 | 7/1987 | Japan | 257/192 |
| 4216636 | 8/1992 | Japan | . |

OTHER PUBLICATIONS

"Planar Buried Contact Heterojunction FET," IBM Technical Disclosure Bulletin, vol. 29, No. 6, Nov. 1986, pp. 2406–2409.
Mat. Res. Soc. Symp. Proc., vol. 240, 1992, pp. 777–781 "GaAs Surface Passivation by InGaP Thin Film", Fumiaki Hyuga et al.
Appl. Phys. Lett., vol. 60, No. 16, Apr. 1992, pp. 1963–1965, "Si-implanted InGaP/GaAs Metal-Semiconductor Field-Effect Transistors", Hyuga et al.
J. Vac. Sci. Technol. B, vol. 6, No. 5, Sep./Oct. 1988, pp. 1526–1529, "Reactively Sputtered WSiN Film Suppresses As and Ga Outdiffusion", Kazuyoshi Asai et al.
Extended Abstracts, JSAP Catalog No. AP 931122-03, No. 3 May, 1993, p. 1185, 28p-ZM-4, "Thermal Stability of WSiN/InGaP Schottky Contacts", Shiojima et al.
The Electrochemical Society, Inc., 184th Meeting Program, Oct. 10–15, 1993, p. 149, "Thermally Stable Schottky Contact On InGaP/GaAs", Shiojima et al.
Inst. Phys. Conf. Ser. No. 33b, 1977, Chapter 3, pp. 145–153, "Effects of Heat Treatment on Metal-InP Schottky Barriers Characterized By Secondary Ion Mass Spectrometry".
International Electron Devices Meeting, Dec. 3–5, 1979, pp. 469–472, "High Temperature Stable Metal-GaAs Contacts", E. Kohn.

*Primary Examiner*—Andrew J. James
*Assistant Examiner*—Courtney A. Bowers
*Attorney, Agent, or Firm*—Spencer, Frank & Schneider

[57] ABSTRACT

A semiconductor circuit device is disclosed in which an impurity ion implanted region is formed in a substrate, a Schottky junction type gate electrode is formed above the impurity ion implanted region, and a source electrode and a drain electrode are formed on both sides of the gate electrode. In this device, an InGaP barrier layer is formed between the substrate and the electrodes, a cap layer comprising a semiconductor free from In as a constituent is formed between the InGaP barrier layer and the electrodes, and the gate electrode is formed of a refractory metal.

8 Claims, 25 Drawing Sheets

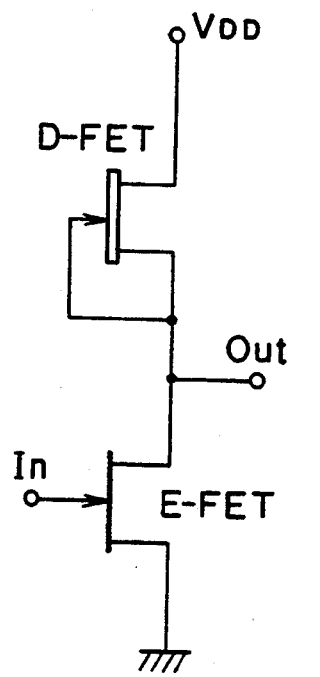
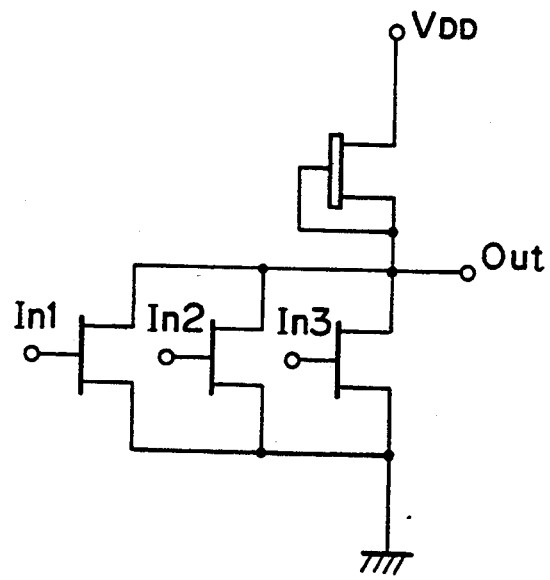
FIG.14          FIG.15
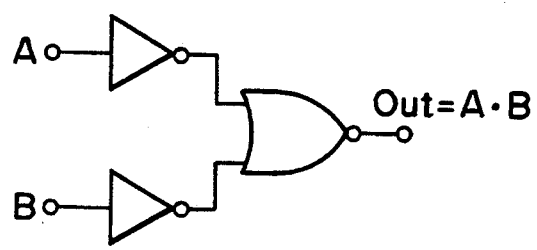
FIG.16

SEMICONDUCTOR CIRCUIT DEVICE AND METHOD FOR PRODUCTION THEREOF

This is a division of application Ser. No. 08/171,396, filed Dec. 22, 1993, now U.S. Pat. No. 5,369,043.

BACKGROUND OF THE-INVENTION

1. Field of the Invention

This invention relates to a semiconductor circuit device called a Schottky junction Field-Effect Transistor, or a Schottky gate FET, or a MEtal-Semiconductor Field-Effect Transistor (MESFET), and a method for production thereof.

2. Description of the Prior Art

As is well known, the semiconductor circuit device is a transistor having a basic structure as illustrated in FIG. 1. A relatively high resistant n type semiconductor layer 2 serving as a channel is formed on a semi-insulating substrate 1. Onto the n type semiconductor layer 2 are joined a metal gate 3 making a Schottky contact with a channel 2c, and a source 4 and a drain 5 making an ohmic contact with the channel 2c with the gate 3 being interposed therebetween.

The operating principle for the semiconductor circuit device is that a depletion region 6 occurs at the junction between the gate 3 and the channel 2c owing to a reverse voltage applied to the gate 3, thereby narrowing the width of the channel 2c, the path for electrons. In this device, therefore, the channel width is varied by a gate voltage to control a drain current.

So far, three methods have been known for producing such a semiconductor circuit device.

A first method will be explained hereinbelow with reference to the formation of two transistors on one substrate. This method is composed of the following 5 steps as shown in FIGS. 2A through 2E:

A) A semi-insulating semiconductor substrate 1 comprising a III-V compound semiconductor is made ready for use. A GaAs substrate is used, for example.
B) A patterned mask layer 10A is formed on the substrate 1. With the mask layer 10A used as a mask, n type impurity ions 11A are implanted to form an ion implanted region 2A.
C) After the mask layer 10A is removed, a patterned mask layer 10B is formed on the substrate 1. With the mask layer 10B used as a mask, n type impurity ions 11B are implanted to form an ion implanted region 2B.
D) After the mask layer 10B is removed, the substrate is annealed to activate the implanted ions and convert the ion implanted regions 2A, 2B into active layers (n type semiconductor regions). On the ion implanted regions 2A, 2B are formed metal gates 3 which make a Schottky contact with these regions.
E) On the ion implanted regions 2A, 2B and on both sides of the gate 3 are formed a source electrode 4 and a drain electrode 5 which make an ohmic contact with these regions.

A second method will be explained hereinbelow with reference to the formation of two transistors on one substrate. This method is composed of the following 5 steps as shown in FIGS. 3A through 3E:

A) A semi-insulating semiconductor substrate 1 comprising a III-V compound semiconductor is made ready for use. A GaAs substrate is used, for example. A conductive semiconductor layer 2 is grown on the substrate 1.
B) A patterned mask layer 10A is formed on the conductive semiconductor layer 2. With the mask layer 10A used as a mask, the conductive semiconductor layer 2 is etched to a desired thickness. C) With the mask 10A being retained, a patterned mask layer 10B is formed on the remaining surface of the conductive semiconductor layer 2. With the mask layers 10A, 10B used as masks, those portions of the conductive semiconductor layer 2 which are other than the portions covered by these mask layers 10A, 10B are removed by etching.
D) After the mask layers 10A, 10B are removed, metal gates 3 which make a Schottky contact with the conductive semiconductor layers 2, 2 are formed on these layers.
E) On each conductive semiconductor layer 2 and on both sides of the gate 3 are formed a source electrode 4 and a drain electrode 5 which make an ohmic contact with the layer 2.

A third method will be explained hereinbelow with reference to the formation of one transistor on one substrate. This method is composed of the following 5 steps as shown in FIGS. 4A through 4E:

A) A semi-insulating semiconductor substrate 1 comprising a III-V compound semiconductor is made ready for use. A GaAs substrate is used, for example.
B) A patterned mask layer 10A is formed on the substrate 1. With the mask layer 10A used as a mask, n type impurity ions 11A are implanted to form an ion implanted region 2A.
C) With the mask 10A being retained, a patterned mask layer 10B is formed on the remaining surface of the substrate 1, i.e. of the ion implanted region 2A. With the mask layer 10B used as a mask, n type impurity ions 11B are implanted on both sides of the ion implanted region 2A to form ion implanted regions 2B, 2B.
D) After the mask layers 10A, 10B are removed, the substrate is annealed to activate the implanted ions and convert the ion implanted regions 2A, 2B into active layers. On the ion implanted region 2A is formed a metal gate 3 which makes a Schottky contact with this region.
E) On the ion implanted region 2B and on both sides of the gate 3 are formed a source electrode 4 and a drain electrode 5 which make an ohmic contact with this region.

The above-described first method and second method are both capable of producing two transistors with different characteristics on a single substrate. Compared with the second method involving etching done twice, the first method using the ion implantation technique is evidently easier to carry out.

The third method, on the other hand, is advantageous in that the n type semiconductor region connected to the source electrode and the n type semiconductor region connected to the drain electrode can have a sufficiently high n type impurity concentration, and source electrode resistance and drain electrode resistance can be lowered. Such a semiconductor circuit device of a structure with a low source electrode resistance and a low drain electrode resistance can be prepared by a method employing etching, like the second method. Clearly, however, the third method is easier to perform than the method using etching.

Of the conventional, methods, the first and third methods are thus superior to the other method. However, the two methods and semiconductor circuit devices obtained by them pose the following problems:

In semiconductor circuit devices obtained by the first and third methods, the n type semiconductor region serving as the active layer is formed by implanting ions into the semi-insulating semiconductor substrate. Therefore, the characteristics of the active layer formed depend on the material characteristics of the semi-insulating semiconductor substrate, the matrix. The semi-insulating semiconductor substrate material often contains impurities, undesirable for the characteristics of the active layer, in amounts that cannot be neglected. Consequently, these conventional methods involve the first problem that the semiconductor circuit device produced cannot exhibit the intended characteristics.

Furthermore, the n type semiconductor region serving as the active layer is formed by implanting ions into the semi-insulating semiconductor substrate, as has been stated previously. Thus, the semi-insulating semiconductor substrate portion and the active layer are integral and have no interface therebetween. That is, the surface of the n type semiconductor region that functions as the active layer and the surface of the semi-insulating semiconductor substrate are coplanar. This means that there is no layer which will prevent electrons in the n type semiconductor region from migrating onto the surface of the semi-insulating semiconductor substrate. On the surface of the semi-insulating semiconductor substrate, on the other hand, a defect layer is often formed during or after the production of the device. In the presence of this defect layer on the surface of the semi-insulating semiconductor substrate, electrons in the n type semiconductor region easily arrive at the defect layer, because there is no layer which will prevent such electrons from migrating onto the surface of the semi-insulating semiconductor substrate, as has been described. As a result, when the transistor becomes operative, noises occur in the defect layer, deteriorating the performance of the device noticeably. This is a second problem with the aforementioned conventional methods, and semiconductor devices produced by them.

No solutions have been proposed to the first problem, while the following solution has been put forward to the second problem:

The solution is in the method described in the three publications: Japanese Patent Application Laying-open No. 216636/1992 (Japanese Patent Application No. 411177/1990), "GaAs SURFACE PASSIVATION BY InGaP THIN FILM," Mat. Res. Soc. Symp. Proc. Vol. 240, pb. 777–781, and "Si-implanted InGaP/GaAs metal-semiconductor field-effect transistors," Appl. Phys. Lett. 60(16), 20 Apr. 1992. The method described in these publications comprises forming on a substrate comprising GaAs an InGaP layer having a wider energy bandgap than that of the substrate, and implanting impurity ions into the GaAs substrate through the InGaP layer to form an impurity ion implanted region which will function as an active layer. This method is free from the above-described drawback that electrons in the impurity ion implanted region serving as the active layer move and reach the defect layer present on the substrate surface, since the InGaP barrier layer with a wide energy bandgap is interposed between the substrate surface and the impurity ion implanted region.

An attempt to attain further improvements in efficiency and performance in that method and the semiconductor circuit device obtained thereby, however, causes anew the problems described below.

A method for producing a semiconductor circuit device efficiently using a refractory metal as a gate electrode material has been proposed which comprises implanting impurity ions into the substrate through the gate electrode as a mask, annealing the substrate as such to activate the impurity ion implanted region. This method is introduced, say, in "Reactively sputtered WSiN film suppresses As and Ga outdiffusion," J. Vac. Sci. Technol. B 6(5), September/October 1988, pp. 1526–1529. This literature also reports that WSiN is ideal as a refractory metal for a gate electrode.

When such a method involving the use of a refractory metal as a gate electrode material and the implantation of impurity ions through the gate electrode as a mask is applied to the production of the aforementioned semiconductor circuit device having an InGaP barrier layer, the following problem appears, making the method impracticable.

That is, annealing causes a reaction between the gate electrode and the InGaP layer, deteriorating the Schottky junction characteristics, thus bringing about an ohmic junction. This problem occurs likewise in the presence of heat subsequently applied to the device, even if a gate electrode is formed after the implantation of impurity ions into the substrate is completed and the impurity ion implanted region is activated by annealing.

This invention aims to solve both of the above-mentioned problems: The first of them is that when there is formed an InGaP layer suitable as a barrier layer for preventing the migration of electrons from the impurity implanted region serving as the active layer into the defect layer present on the substrate surface, the Schottky junction deteriorates and becomes an ohmic junction, if the gate electrode making a Schottky contact with the InGaP layer undergoes heat. The second problem is that the active layer is influenced by the material characteristics of the substrate, thus failing to give the desired characteristics. Through this solution, the invention is intended to provide a semiconductor circuit device with high performance.

SUMMARY OF THE INVENTION

A semiconductor circuit device according to the present invention comprises;
a semi-insulating semiconductor substrate comprising a first III-V compound semiconductor,
a semi-insulating barrier layer comprising InGaP with a wider energy bandgap than that of the first III-V compound semiconductor, and being formed on the semi-insulating semiconductor substrate,
an n type semiconductor region being formed in an upper portion of the semiconductor substrate in contact with the barrier layer, and having n type impurity ions diffused in the semiconductor substrate as a matrix,
a semi-insulating cap layer comprising a semiconductor with a narrower energy bandgap than that of the InGaP and free from In as a constituent element, and being formed on the barrier layer,
a refractory metal gate electrode being formed on the cap layer above the n type semiconductor region, and making a Schottky junction with the cap layer, and
a source electrode and a drain electrode being formed at opposite positions across the gate electrode on the cap layer above the n type semiconductor region, and being connected in an ohmic manner to the n type semiconductor region through the cap layer and the barrier layer.

A first method for producing a semiconductor circuit device according to the present invention comprises;

a step of forming on a semi-insulating semiconductor substrate comprising a first III-V compound semiconductor a semi-insulating barrier layer comprising InGaP with a wider energy bandgap than that of the first III-V compound semiconductor, a step of forming a semi-insulating cap layer comprising a semiconductor with a narrower energy bandgap than that of the InGaP and free from In as a constituent element, a step of forming a patterned mask layer on the cap layer, and implanting n type impurity ions into the substrate through the mask layer as a mask to form an n type impurity ion implanted region, a step of depositing an annealing cap film on the cap layer after the mask layer is removed, and annealing the substrate to activate the impurity ion implanted region and convert it into an n type semiconductor region, a step of providing an opening at a position of the annealing cap film above the n type semiconductor region, and forming a gate electrode comprising a refractory metal, and a step of providing openings at opposite positions, across the gate electrode, of the annealing cap film, and forming a source electrode and a drain electrode.

A second method for producing a semiconductor circuit device according to the present invention comprises;

a step of forming a first patterned mask layer on a semi-insulating semiconductor substrate comprising a first III-V compound semiconductor, and implanting n type impurity ions into the substrate through the first mask layer as a mask to form a first n type impurity ion implanted region, a step of forming second mask layer with a pattern different from that of the first mask layer on the semi-insulating semiconductor substrate after the first mask layer is removed, and implanting n type impurity ions through the second mask layer as a mask to form a second impurity ion implanted region, a step of forming a semi-insulating barrier layer comprising InGaP with a wider energy bandgap than that of the first III-V compound semiconductor on the substrate after the second mask layer is removed, a step of forming a semi-insulating cap layer comprising a semiconductor with a narrower energy bandgap than that of the InGaP and free from In as a constituent element, a step of depositing an annealing cap film on the cap layer, and annealing the substrate to activate the impurity ion implanted region and convert it into an n type semiconductor region, a step of providing an opening at a position of the annealing cap film above the n type semiconductor region, and forming a gate electrode comprising a refractory metal, and a step of providing openings at opposite positions, across the gate electrode, of the annealing cap film, and forming a source electrode and a drain electrode.

A third method for producing a semiconductor circuit device according to the present invention comprises;

a step of forming on a semi-insulating semiconductor substrate comprising a first III-V compound semiconductor a semi-insulating barrier layer comprising InGaP With a wider energy bandgap than that of the first III-V compound semiconductor, a step of forming a semi-insulating cap layer comprising a semiconductor with a narrower energy bandgap than that of the InGaP and free from In as a constituent element, a step of forming a first mask layer with a desired pattern on the cap layer, and implanting n type impurity ions from the cap layer side through the first mask layer as a mask to form a first impurity ion implanted region, a step of forming a gate electrode comprising a refractory metal on the cap layer above the ion implanted region after the mask layer is removed, a step of forming a second mask layer with a pattern different from that of the first mask layer on the cap layer, and implanting n type impurity ions from the cap layer side through the second mask layer and the gate electrode as masks to form a second impurity ion implanted region, a step of depositing an annealing cap film on the cap layer after the second mask layer is removed, and annealing the substrate to activate the impurity ion implanted region and convert it into an n type semiconductor region, and a step of providing openings at opposite positions, across the gate electrode, of the annealing cap film, and forming a source electrode and a drain electrode.

A fourth method for producing a semiconductor circuit device according to the present invention comprises;

a step of forming a first patterned mask layer on a semi-insulating semiconductor substrate comprising a first III-V compound semiconductor, and implanting n-type impurity ions into the substrate through the first mask layer as a mask to form a first n type impurity ion implanted region, a step of forming a semi-insulating barrier layer comprising InGaP with a wider energy bandgap than that of the first III-V compound semiconductor on the substrate after the first mask layer is removed, a step of forming a semi-insulating cap layer comprising a semiconductor with a narrow energy bandgap than that of the InGaP and free from In as a constituent element, a step of forming a gate electrode comprising a refractory metal on the cap layer above the ion implanted region, a step of forming a second mask layer with a pattern different from that of the first mask layer on the cap layer, and implanting n type impurity ions from the cap layer side through the second mask layer and the gate electrode as masks to form a second impurity ion implanted region, a step of depositing an annealing cap film on the cap layer after the second mask layer is removed, and annealing the substrate to activate the impurity ion implanted region and convert it into an n type semiconductor region, and a step of providing openings at opposite positions, across the gate electrode, of the annealing cap film, and forming a source electrode and a drain electrode.

In the construction of each of the above-described device and production methods according to the present invention, the semiconductor substrate has a structure comprising only a single semi-insulating semiconductor substrate, or a structure comprising a single semi-insulating semiconductor substrate and a semi-insulating semiconductor layer formed thereon by epitaxial growth. In the present invention, when the constituent material of the single semi-insulating semiconductor substrate used as a substrate has high purity, the epitaxially grown semi-insulating semiconductor layer may be omitted, and only the single semi-insulating semiconductor substrate may compose a substrate. However, commercially available substrate materials often contain nonnegligible amounts of impurities, and their surface characteristics are not satisfactory. Usually, therefore, it is recommendable to form an epitaxial layer on a single substrate to use it as substrate for lamination, and implant impurity ions into the epitaxial layer, thereby forming an impurity ion implanted region in the epitaxial layer. In this case, the epitaxial layer to serve as a matrix for the impurity implanted region can easily be made highly pure, so that the characteristics of the impurity implanted region serving as an active layer can be improved. The epitaxial layer also has high purity and satisfactory surface characteristics. Its lattice constant can also be controlled. Thus, the advantage is obtained that the thickness of the InGaP barrier layer formed on the epitaxial layer can be controlled easily, and the barrier characteristics can be improved easily.

According to the construction of the present invention, moreover, a structure can be accomplished in which an impurity ion concentration in the impurity ion implanted region formed in the matrix, the semiconductor substrate below the barrier layer, is higher in the region situated below the source electrode and the drain electrode than in the region situated below the gate electrode. Furthermore, a construction can be achieved in which the thickness of the region situated below the gate electrode is much smaller than the region situated below the source electrode and the drain electrode. As stated earlier, when the semi-insulating semiconductor substrate has a structure comprising a single semi-insulating semiconductor substrate and a semi-insulating semiconductor layer formed thereon by epitaxial growth, the impurity ion implanted region is formed in the epitaxially grown semiconductor layer.

In the present invention, the presence of the semi-insulating cap layer prevents a reaction between the InGaP layer and the gate electrode comprising a refractory metal, so that the Schottky junction of the gate electrode is free from deterioration. The formation of this cap layer has been contemplated in view of the following finding: The deterioration of the Schottky junction of the gate electrode when the InGaP layer is used as a barrier layer has been found ascribable to a thermal reaction between the indium in the InGaP layer and the tungsten in WSiN, for example, used as a refractory gate electrode material. As described previously, therefore, it is important for the constituent material of the cap layer to contain no indium. To play the role of the cap layer, the cap layer should desirably have a thickness of 250 Å or less, more preferably, from 50 to 250 Å.

As the refractory metal material constituting the gate electrode, WSiN is preferred.

In the construction of the present invention, a structure is also possible in which one substrate is provided with a plurality of impurity implanted regions, gate electrodes, source electrodes and drain electrodes. In this case, the characteristics of the respective elements may be different individually, and the individual elements are functionally connected together to make up one large-scale semiconductor circuit on one substrate. To form such plural elements on a single substrate, it suffices to repeat plural times the initial impurity ion implantation step using the mask layer while varying the position of providing the opening in the mask.

The above and other objects, effects, features and advantages of the present invention will become more apparent from the following description of embodiments thereof taken in conjunction with the accompanying drawings.

BRIEF DESCRIPTION OF THE DRAWINGS

FIG. 14 is a circuit diagram showing an example of a semiconductor circuit device obtained by the present invention;

FIG. 15 is a circuit diagram showing another example of a semiconductor circuit device obtained by the present invention; and FIG. 16 is a conceptual circuit diagram showing still another example of a semiconductor circuit device obtained by the present invention.

DETAILED DESCRIPTION OF PREFERRED EMBODIMENTS

Embodiment 1

A method for producing a semiconductor circuit device according to the present invention as illustrated in FIGS. 5A to 5H comprises the successive steps described below.

Figure 1:
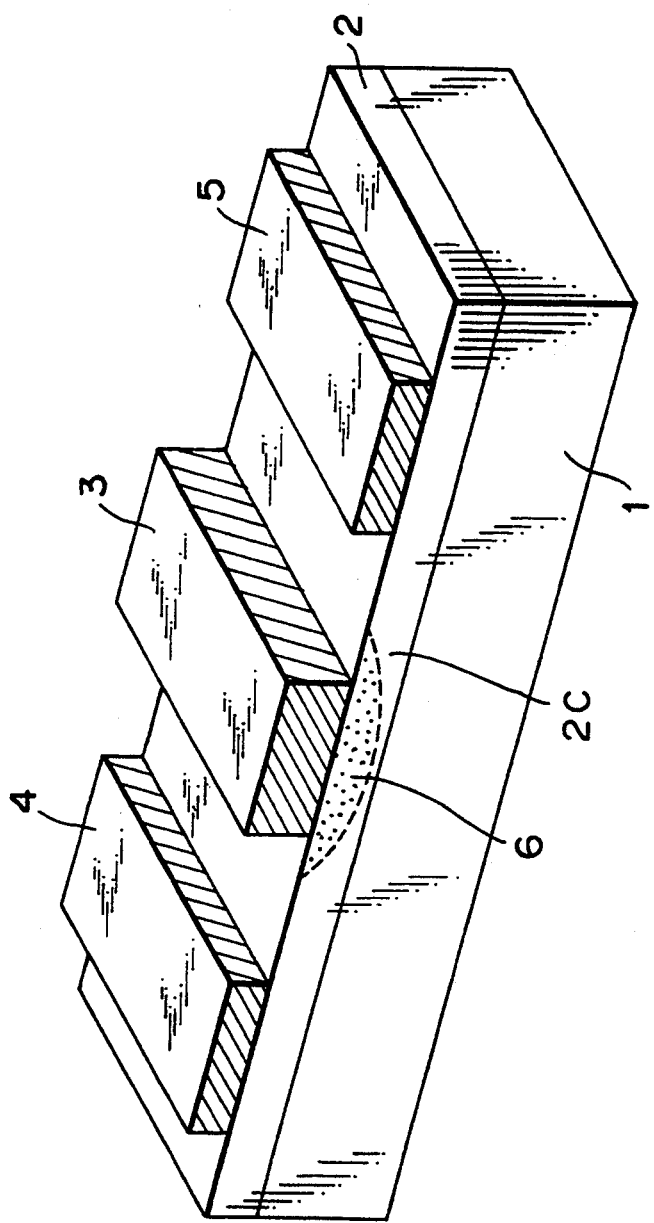
FIG. 1 is a perspective view showing the basic structure of a conventional semiconductor circuit device.
Figure 2A:
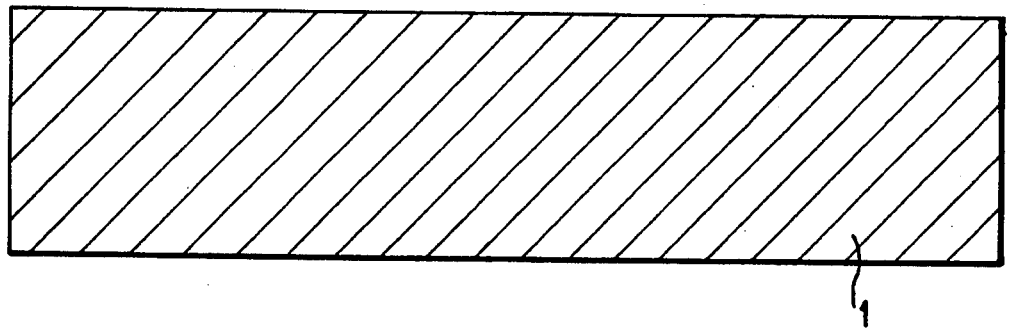
FIGS. 2A to 2E are each a process drawing showing an example of a method for producing a conventional semiconductor device (with two elements)
Figure 2B:
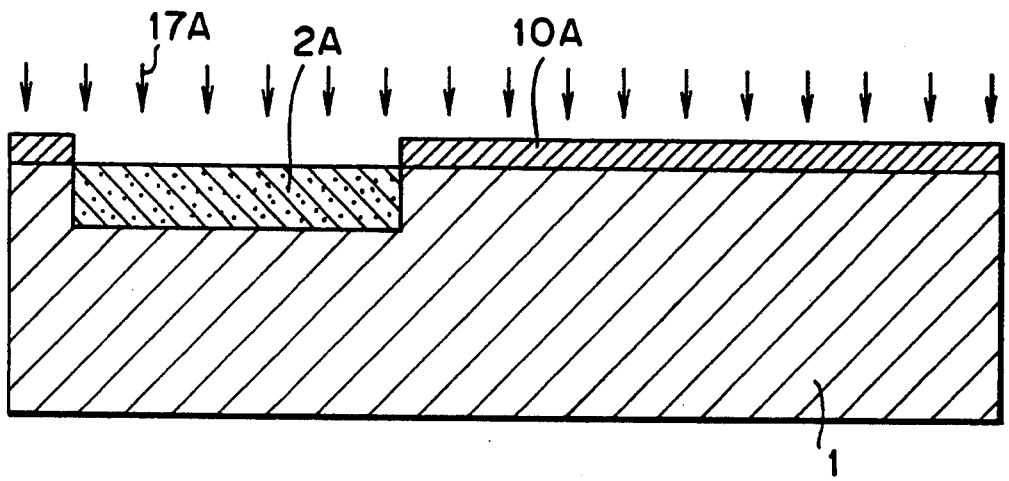
Figure 2C:
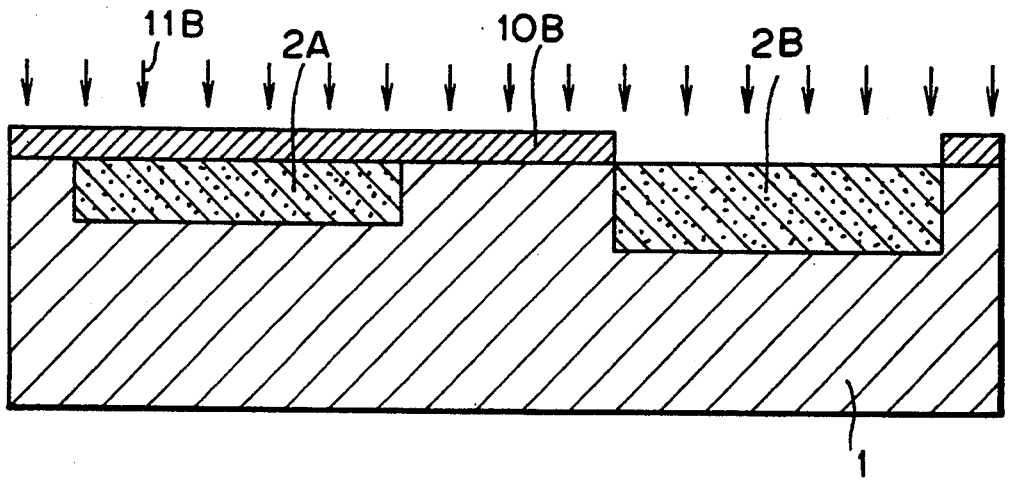
Figure 2D:
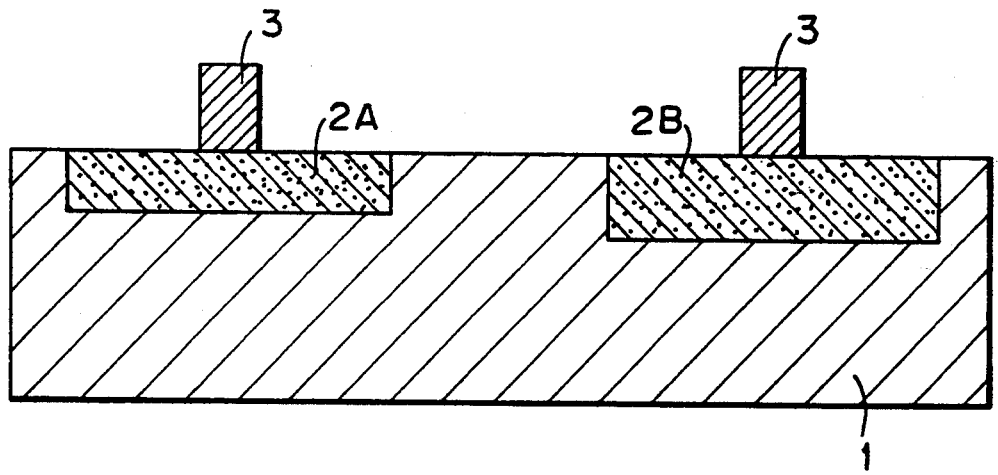
Figure 2E:
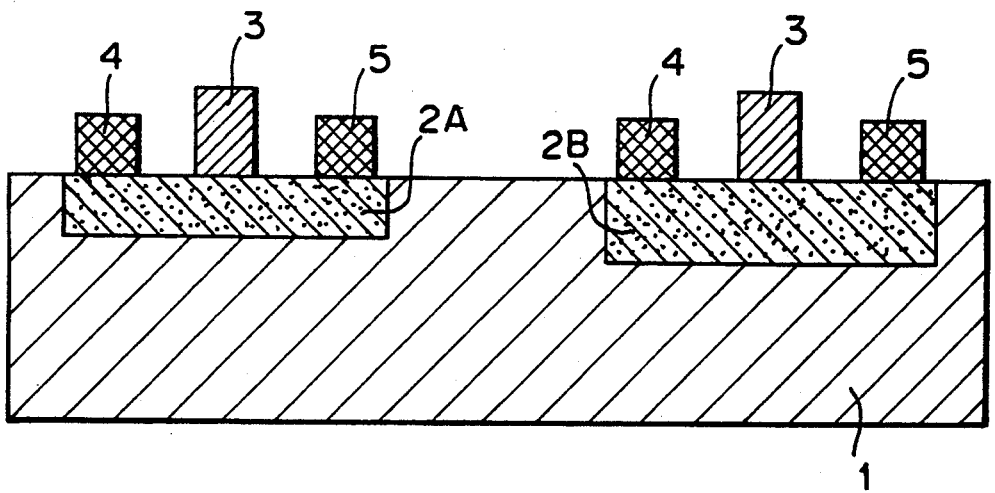
Figure 3A:
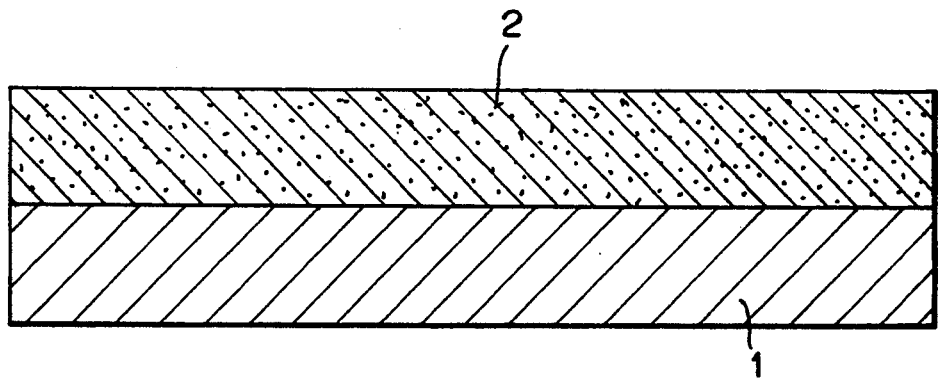
FIGS. 3A to 3E are each a process drawing showing another example of a method for producing a conventional semiconductor device (with one element)
Figure 3B:
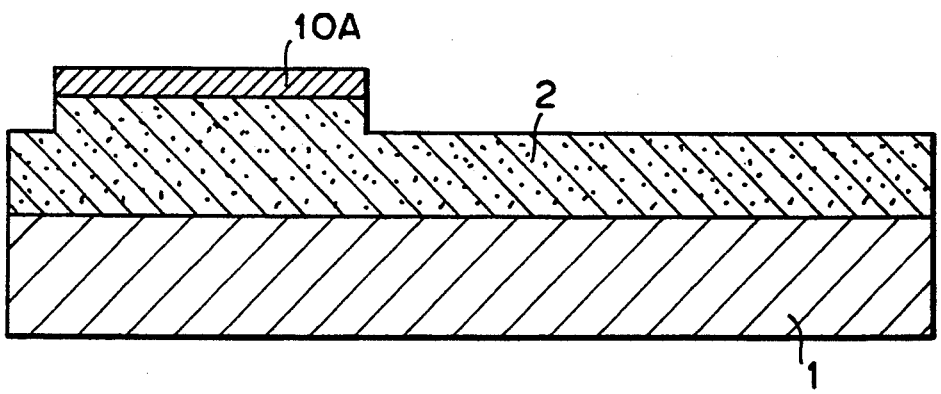
Figure 3C:
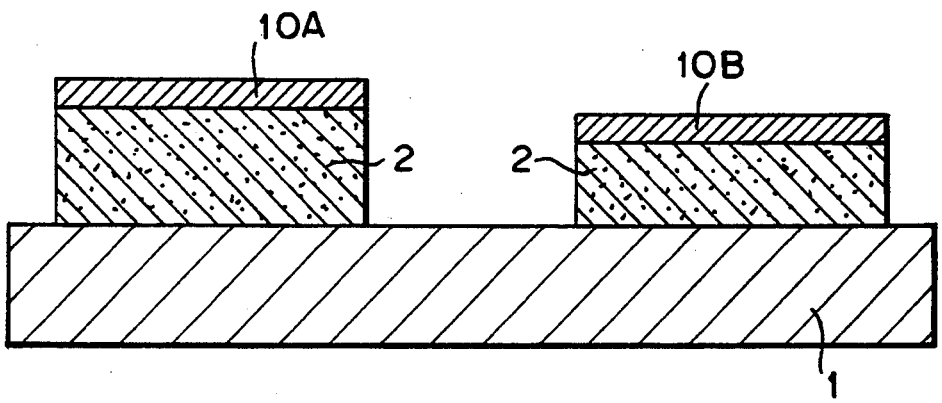
Figure 3D:
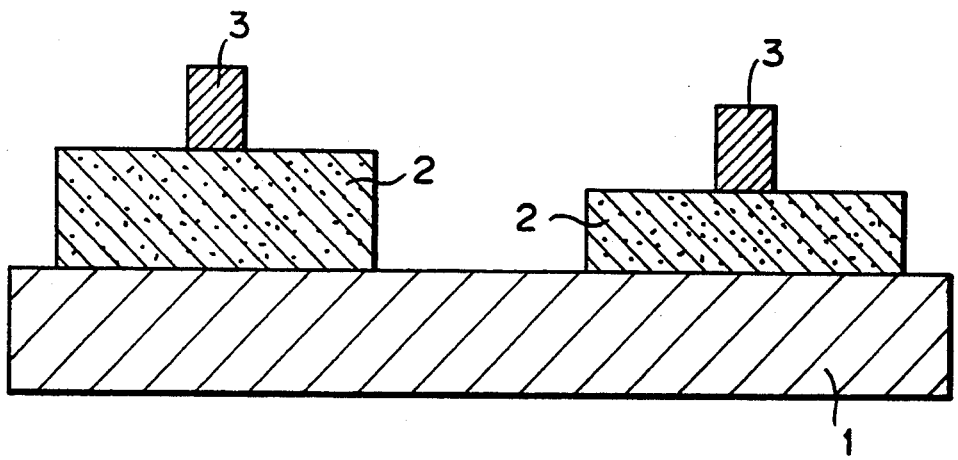
Figure 3E:
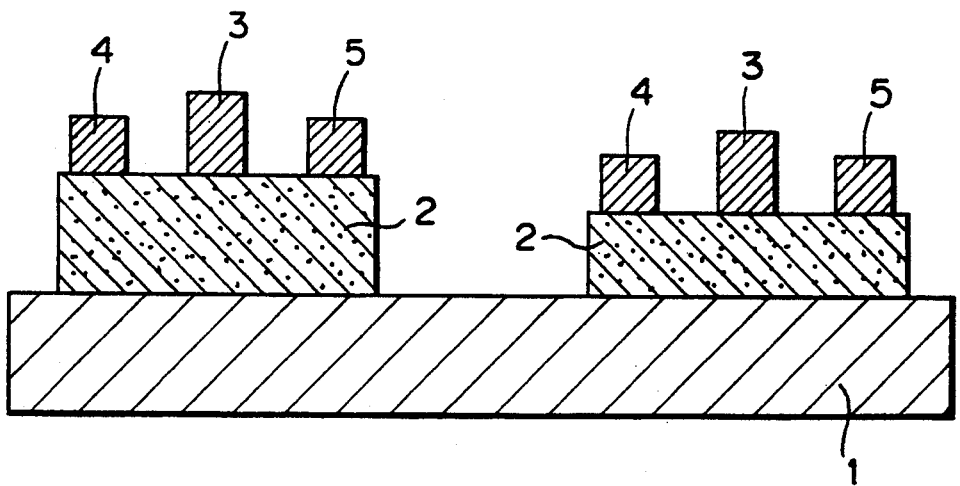
Figure 4A:
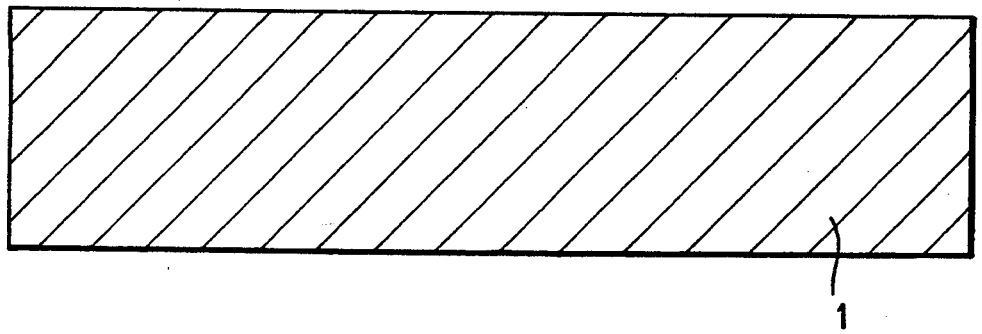
FIGS. 4A to 4E are each a process drawing showing still another example of a method for producing a conventional semiconductor device (with one element)
Figure 4B:
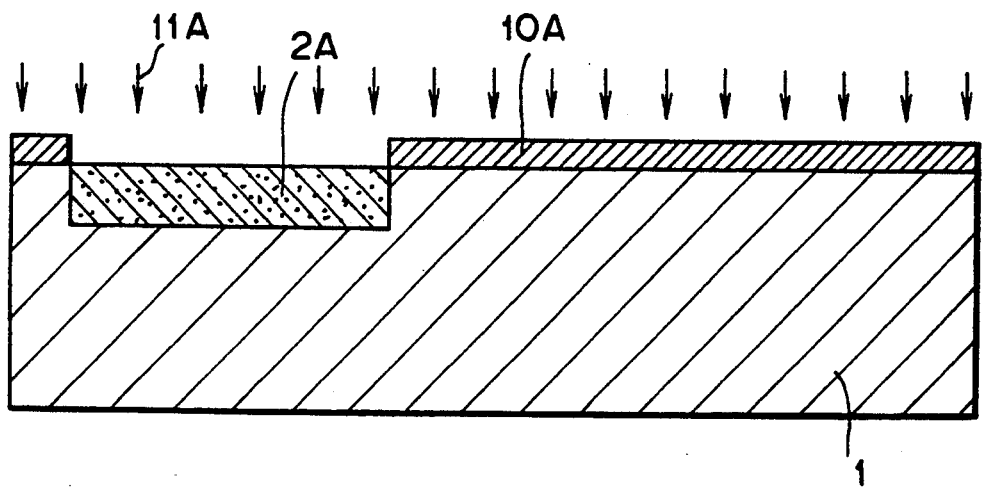
Figure 4C:
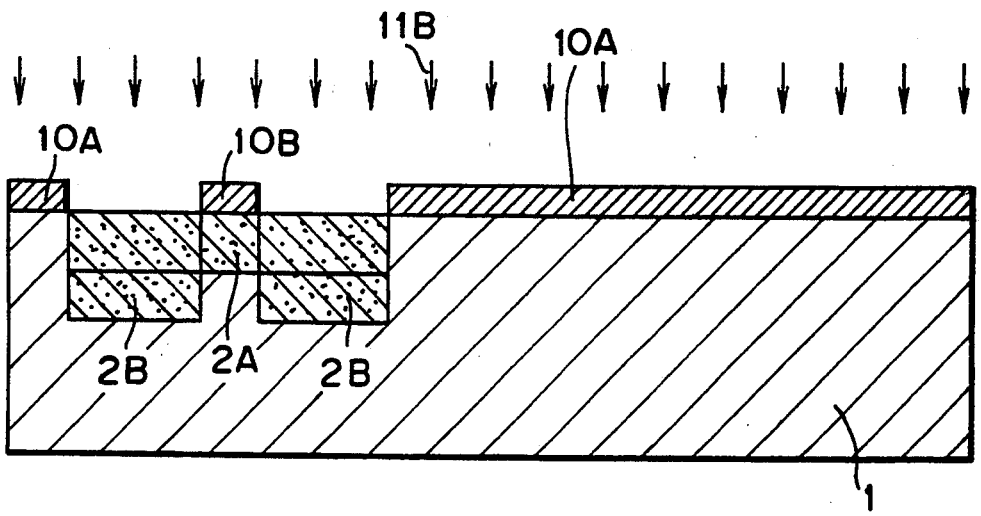
Figure 4D:
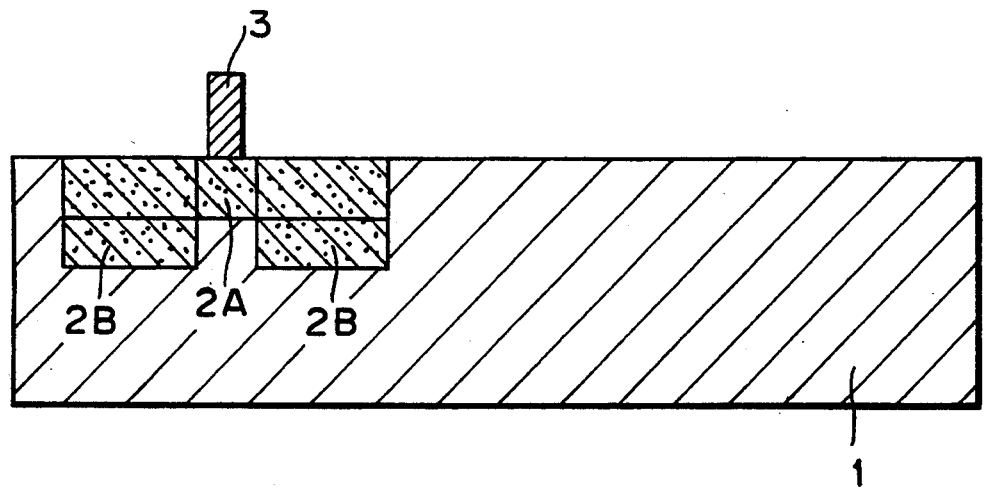
Figure 4E:
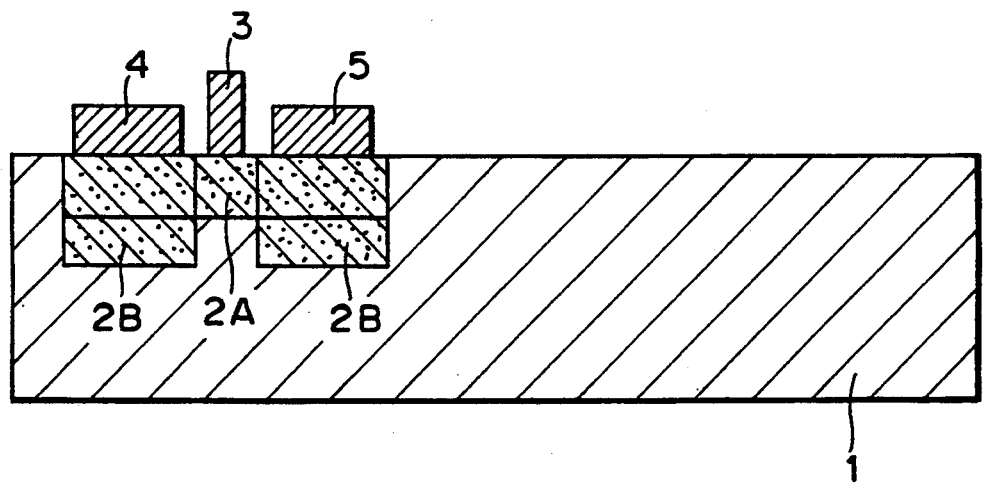
Figure 5A:
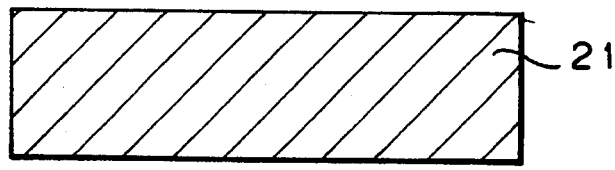
FIGS. 5A to 5H are each a cross sectional view showing a semiconductor circuit device produced according to a first embodiment of the present invention, in successive steps for illustrating a method for producing the device.

As shown in FIG. 5A, a semi-insulating semiconductor substrate body 21 comprising GaAs as a first semi-insulating III-V compound semiconductor is made ready for use.

Figure 5B:
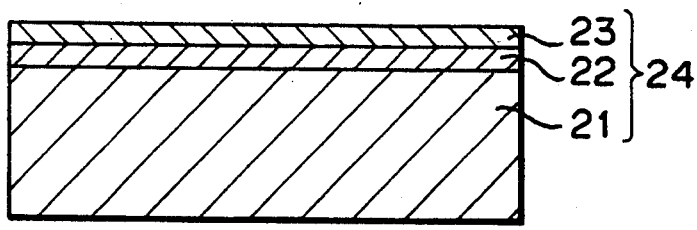

On the semi-insulating semiconductor substrate body 21 are successively formed by a known epitaxial growth technique a semi-insulating barrier layer 22 comprising InGaP with a wider energy bandgap than that of the first semi-insulating III-V compound semiconductor and having a thickness of, say, 100 Å and a semi-insulating cap layer 23 comprising GaAs as a semiconductor with a narrower energy bandgap than that of the InGaP and having a thickness of, say, 100 Å. A semiconductor substrate 24 is thus obtained which has a structure comprising the semi-insulating barrier layer 22 and the semi-insulating cap layer 23 laid in this order on the semi-insulating semiconductor substrate body 21 (FIG. 5B).

Figure 5C:
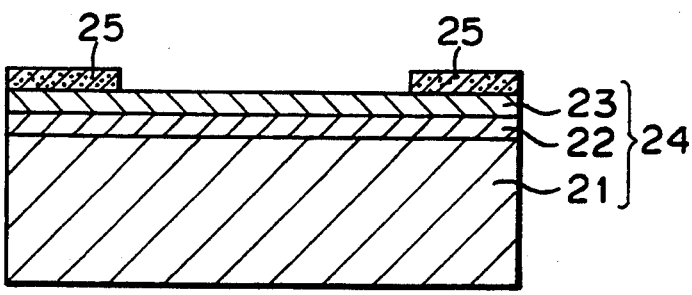

On the semiconductor substrate 24 is formed a mask layer 25 with a desired pattern by various methods known per se (FIG. 5C).

Figure 5D:
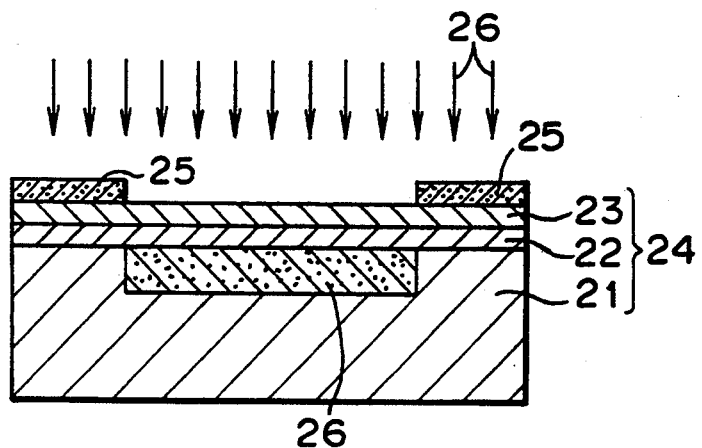

Then, ions 26 of, say, Si as n type impurities are implanted into the semiconductor substrate 24 from the semi-insulating cap layer 23 side through the cap layer 23 and the barrier layer 22 in an implantation amount of, say, $1.5 \times 10^{13}/cm^2$ at an acceleration energy of, say, 30 keV, whereby an n type impurity ion implanted region 27 is formed on the semi-insulating barrier layer 22 side of the semi-insulating semiconductor substrate body 21 (FIG. 5D).

Figure 5E:
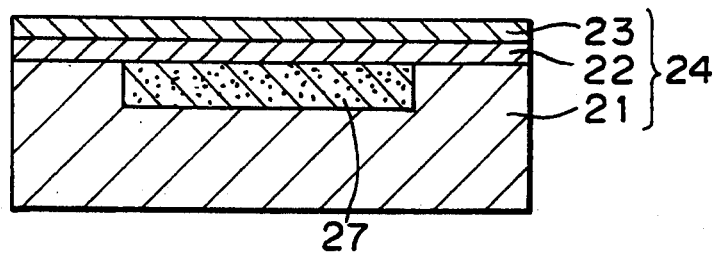

Then, the mask layer 25 is removed from the surface of the cap layer 23 by various methods known per se (FIG. 5E).

Figure 5F:
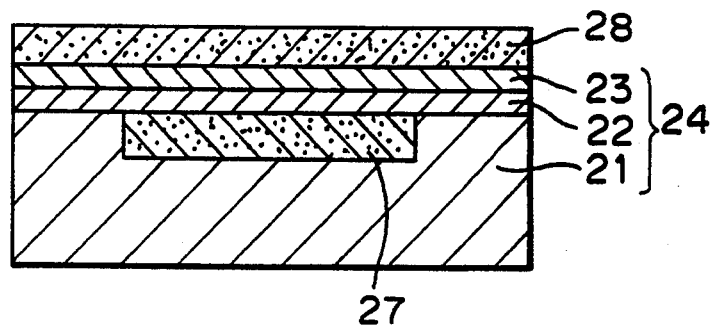

On the cap layer 23 is formed an annealing cap film 28 comprising, say, SiN and having a thickness of, say, 1500 Å, by various methods known per se (FIG. 5F).

Figure 5G:
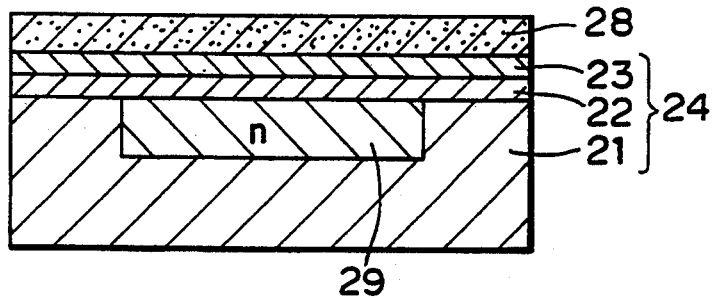

Then, the substrate is annealed for 10 minutes at a temperature of, say, 800° C. to activate the n type impurity ion implanted region 27 and accordingly form an n type semiconductor region 29 from the n type impurity ion implanted region 27 on the semi-insulating barrier layer 22 side of the semi-insulating semiconductor substrate body 21 (FIG. 5G).

Figure 5H:
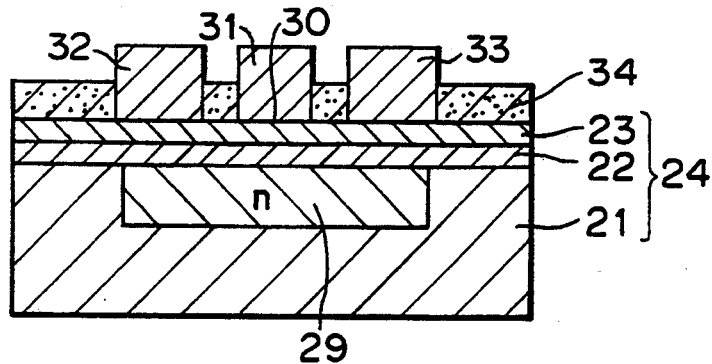

After the annealing cap film 28 on the cap layer 23 is removed, a refractory gate electrode 31 comprising, say, WSiN which forms a Schottky junction 30 with the semi-insulating cap layer 23, and a source electrode 32 and a drain electrode 33 which are connected in an ohmic manner to the n type semiconductor region 29 through the semi-insulating cap layer 23 and the semi-insulating barrier layer 22 at both opposite positions across the refractory metal gate electrode 31 are formed on the cap layer 23 by methods known per se (FIG. 5H). In FIG. 5H, the reference numeral 34 is a protective layer comprising an insulating material formed on the semiconductor substrate 24 when the gate electrode 31, the source electrode 32 and the drain electrode 33 are formed.

The ohmic junctions between the source electrode 32 or the drain electrode 33 and the n type semiconductor region 29 are provided as follows. After the metal electrodes are deposited, the semiconductor substrate 24 is annealed at a lower temperature of, say, 350° C.–400° C. to diffuse the metal to the semiconductor region 29. Thus diffusion regions of the metal become alloyed state to connect the electrodes to n type semiconductor region 29 ohmicly.

The foregoing is thee first embodiment of the method for producing a semiconductor circuit device in accordance with the present invention.

According to this embodiment, the n type semiconductor region 29 as the active layer is formed by the implantation of n type impurity ions into the semi-insulating semiconductor substrate body 21, in compliance with the aforementioned method for producing a conventional semiconductor circuit device. Thus, it is easier, than in the conventional method, to form the n type semiconductor region 29 with dimensions, depths, n type impurity concentration, etc. controlled at desired values for the active layer.

Figure 6:
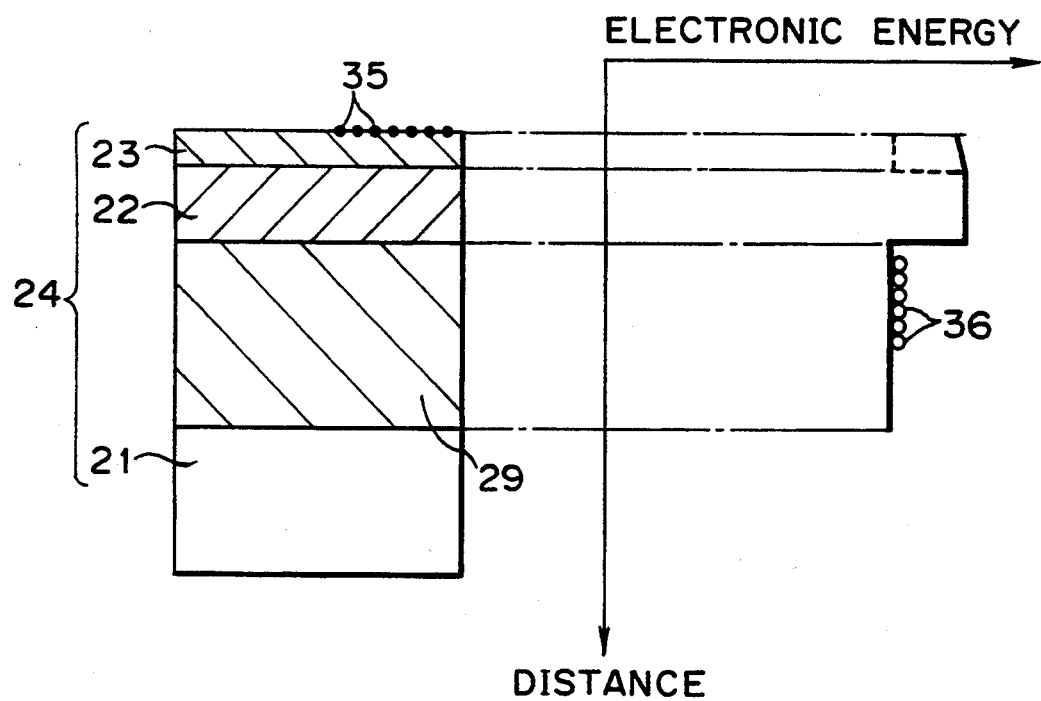
FIG. 6 is a schematic cross sectional view showing a semiconductor circuit device produced by the method for producing the device illustrated in the first embodiment of the present invention, given along with the energy at the conduction band bottom of each member.

The semiconductor circuit device produced by the method of the instant embodiment also has a structure in which the n type semiconductor region 29 as the active layer does not form the surface of the semiconductor substrate, and the semi-insulating barrier layer 22 and the semi-insulating cap layer 23 are interposed in this order between the n type semiconductor region 29 and the surface of the semiconductor substrate. Therefore, even if a defect layer 35 is formed on the surface of the semiconductor substrate 24 during or after the production of the Schottky junction field-effect transistor, as shown in FIG. 6, the layer becoming a barrier against the migration of electrons 36 in the n type semiconductor region 29 into the defect layer 35 is present between the n type semiconductor region 29 and the defect layer 35. Hence, if the semi-insulating barrier layer 22 is formed relatively thick, that is, if the semi-insulating barrier layer 22 composed of an InGaP material is formed with a thickness of more than 50 Å, say, 100 Å as set forth above, electrons 36 in the n type semiconductor region 29 minimally reach the defect layer 35 on the surface of the semiconductor substrate 24, thus effectively preventing the generation of noises due to the defect layer 35 during the operation of the semiconductor circuit device.

Figure 7:
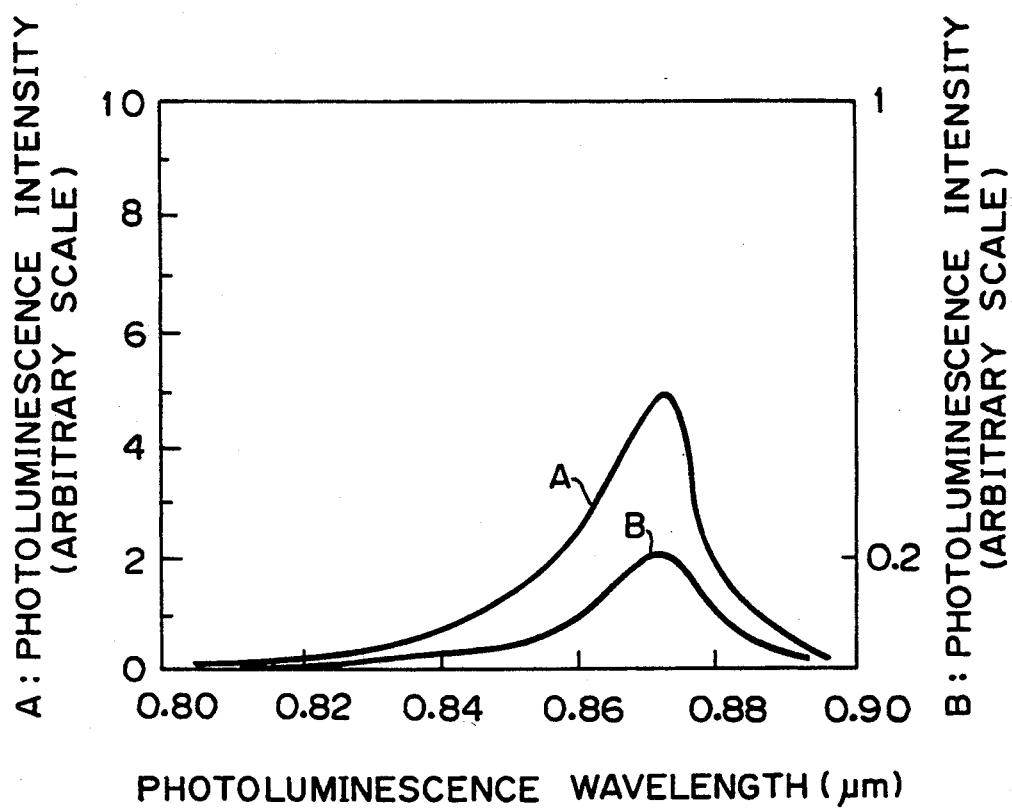
FIG. 7 is a graph illustrating the relationship of photoluminescence intensity to wavelength for a semiconductor substrate in a semiconductor circuit device produced by the method for producing the device illustrated in the first embodiment of the present invention.

This was verified by the following experiments:

(a) A laser beam (wavelength 0.5145 μm) was projected to the semiconductor substrate 24 of FIG. 5B comprising the semi-insulating barrier layer 22 and the semi-insulating cap layer 23 laminated in this order on the semi-insulating semiconductor substrate body 21. The intensity of light emitted from the semiconductor substrate 24, i.e. photoluminescence intensity, was measured with respect to its wavelength. The intensity of light is shown in curve A in FIG. 7. The same measurement of photoluminescence intensity was performed for the semi-insulating semiconductor substrate body 21 of FIG. 5A corresponding to the semi-insulating semiconductor substrate in a semiconductor circuit device produced by the conventional method for producing the device. The intensity was as shown in curve B in FIG. 7.

Figure 8:
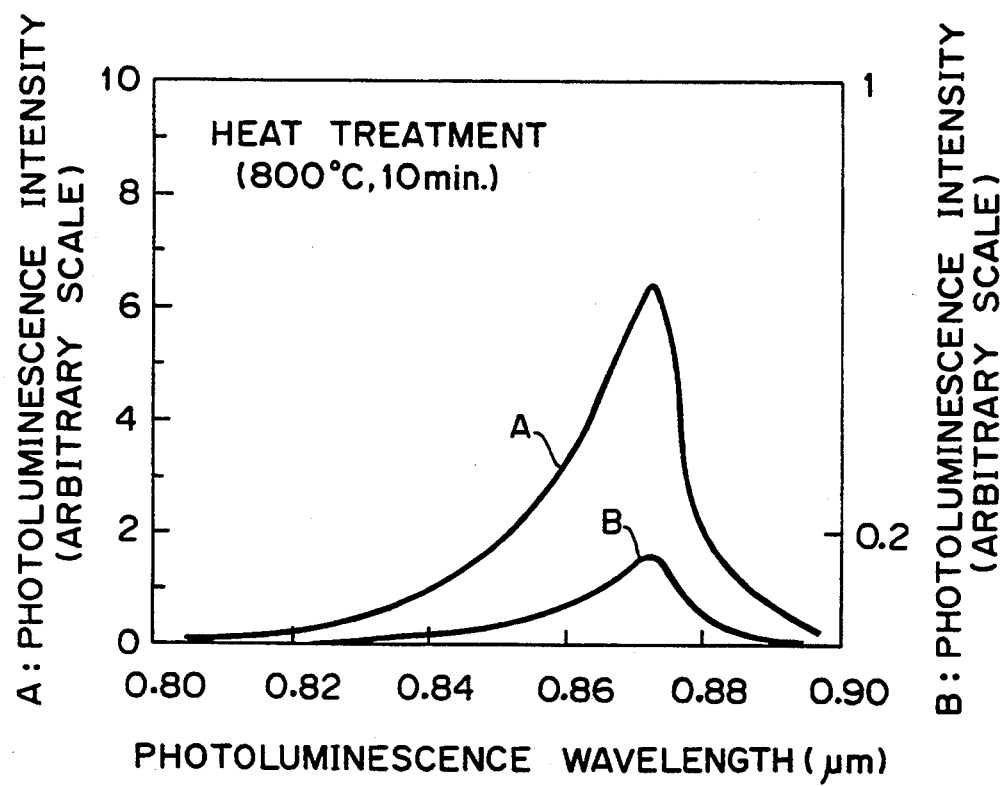
FIG. 8 is a graph illustrating the relationship of photoluminescence intensity to wavelength for a semiconductor substrate after receiving a relatively high heat in a semiconductor circuit device produced by the method for producing the device illustrated in the first embodiment of the present invention.

(b) An annealing cap film as illustrated in FIG. 5F was formed on the semiconductor substrate of FIG. 5B, and this semiconductor substrate with the annealing cap film was annealed for 10 minutes at 800° C. as described with reference to FIG. 5G. Then, the above-mentioned measurement of photoluminescence intensity was carried out. The intensity of light is shown in curve A in FIG. 8. The same annealing cap film as mentioned above was formed on the semi-insulating semiconductor substrate body 21 of FIG. 5A corresponding to the semi-insulating semiconductor substrate in a semiconductor circuit device produced by the conventional method for producing the device. Then, the same annealing was conducted for the semi-insulating semiconductor substrate body 21 with the annealing cap film. The same measurement of photoluminescence intensity was performed. The intensity was as shown in curve B in FIG. 8.

Figure 9:
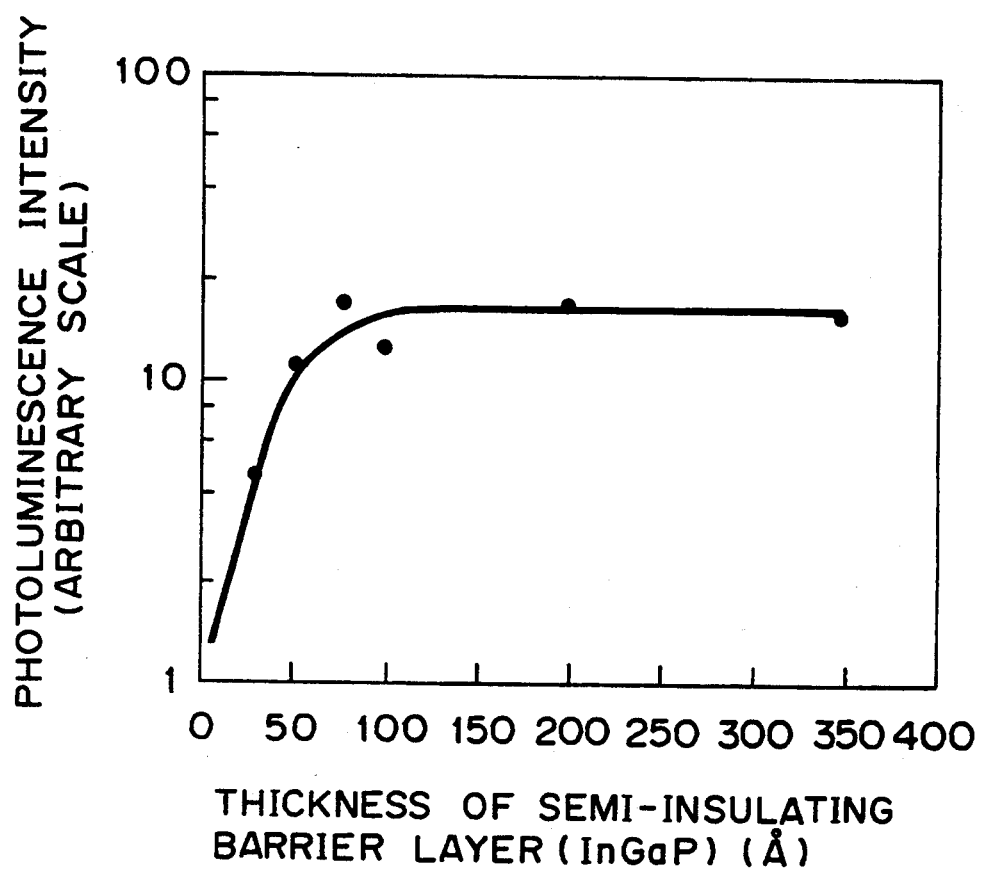
FIG. 9 is a graph illustrating the relationship of photoluminescence intensity to the thickness of a semi-insulating barrier layer for a semiconductor substrate in a semiconductor circuit device produced by the method for producing the transistor illustrated in the first embodiment of the present invention.

(c) For the semiconductor substrate 24 shown in FIG. 5B, the same measurement of photoluminescence intensity was performed, however, with the thickness of the semi-insulating barrier layer 22 being varied. The results shown in FIG. 9 were obtained.

Furthermore, the semiconductor circuit device illustrated in the instant embodiment 1 has a structure in which the gate electrode 31 is formed on the semiconductor substrate so as to form the Schottky junction 30 with the semi-insulating cap layer 23. Therefore, the Schottky junction 30 provided between the gate electrode 31 and the semi-insulating cap layer 23 constitutes a barrier against electrons when the n type semiconductor region 29 side as the active layer is viewed from the gate electrode 31 side. However, the semi-insulating barrier layer 22 against electrons is present between the semi-insulating cap layer 23 and the n type semiconductor region 29. For this reason, even if the semi-insulating cap layer 23 is formed of a material with a lower conduction band bottom (e.g. GaAs) than that of the material of the semi-insulating barrier layer 22, as shown in FIG. 6, the conduction band bottom energy of the semi-insulating cap layer 23 will increase from the level indicated by the broken line to the level indicated by the solid line in FIG. 6, provided that the thickness of the cap layer 23 is not very large, say, 50 to 250 Å. Consequently, the conduction band bottom on the surface of the semi-insulating cap layer 23, accordingly, the surface of the semiconductor substrate is raised to the conduction band bottom of the semi-insulating barrier layer 22, or to an energy close to it. As a result, the height of the barrier against electrons by the Schottky junction 30 when the n type semiconductor region 29 side as the active layer is viewed from the gate electrode 31 side becomes larger than in the absence of the semi-insulating barrier layer 22. Hence, when the semiconductor circuit device is used as a binary logic circuit element (on-off element), logic amplitude can be made larger than in the absence of the semi-insulating barrier layer 22, thus increasing the operation margin of the binary logic circuit element.

Figure 10:
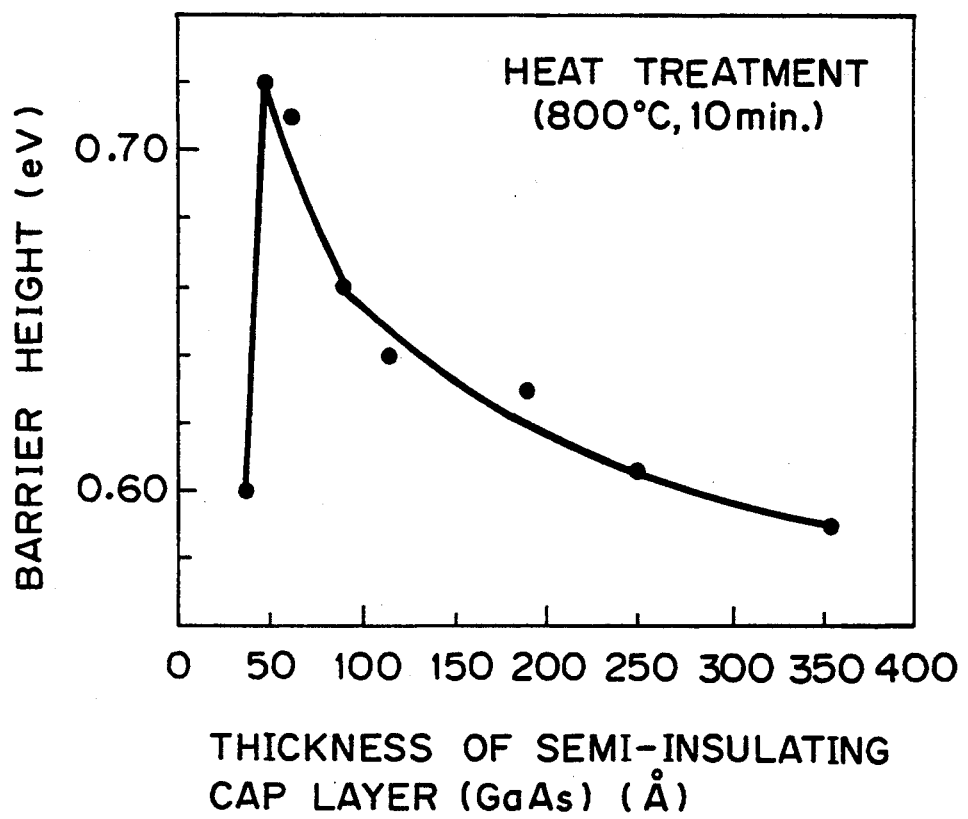
FIG. 10 is a graph illustrating the barrier height against electrons by Schottky junction when the n type semiconductor region side is viewed from the gate electrode side, with respect to the thickness of a semi-insulating cap layer after receiving a relatively high heat in a semiconductor circuit device produced by the method for producing the device illustrated in the first embodiment of the present invention.

The semiconductor circuit device of the instant embodiment is constructed such that the gate electrode 31 is connected to the semi-insulating cap layer 23 so as to form a Schottky junction 30. Assume, in this case, that the gate electrode 31 and the semi-insulating cap layer 23 are constructed of material using elements which avoid the situation that when a relatively high heat is given to the semiconductor circuit device, a reaction easily takes place between the element of the material constituting the gate electrode 31 and the element of the material constituting the semi-insulating cap layer 23. In other words, the gate electrode 31 is constructed of a material comprising, say, WSiN as stated above, and the semi-insulating cap layer 23 is constructed of a material comprising, say, GaAs as stated above. Under this situation, when a relatively high heat, say, of 800° C. or higher is given to the semiconductor circuit device, a reaction between the element of the material making up the gate electrode 31 (e.g. WSiN) and the element of the material making up the semi-insulating cap layer 23 (e.g. GaAs) can be prevented effectively. Also, assume that the thickness of the semi-insulating cap layer 23 is kept within a range in which the operation margin of the binary logic circuit element can be increased as mentioned-above, namely, that the semi-insulating cap layer 23 composed of, say, GaAs is adjusted to 50–250 Å as shown in FIG. 10. Under this situation, even if a relatively high heat, say, of 800° C. or higher is given to the semiconductor circuit device, or even if the gate electrode 31 is composed of WSiN which is apt to react easily with the In in the semi-insulating barrier layer 22, a reaction between the element constituting the material of the gate electrode 31 (WSiN), especially W, and the element constituting the material of the semi-insulating barrier layer 22 (InGaP), especially In, can be prevented effectively.

This will become apparent from the aforementioned experiments on a semiconductor circuit device comprising the semi-insulating barrier layer 22 of InGaP, the gate electrode 31 of WSiN, and the semi-insulating cap layer 23 of GaAs. In these experiments, a heat of 800° C. was applied to the transistor for 10 minutes, whereafter the height of the barrier against electrons by the Schottky junction 30 when the n type semiconductor region 29 side was viewed from the gate electrode 31 side was measured with respect to the thickness of the semi-insulating cap layer 23. The results shown in FIG. 10 were obtained.

Embodiment 2

Next, a second embodiment of the present invention will be described with reference to FIGS. 11A to 11K.

A method for producing a semiconductor circuit device as shown in this second embodiment comprises the below-described successive steps, thereby producing a semiconductor circuit device having first and second transistors with different characteristics from each other.

Figure 11A:
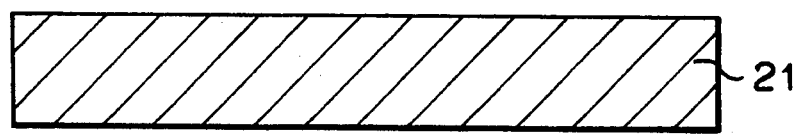
FIGS. 11A to 11K are each a cross sectional view showing a semiconductor circuit device produced according to a second embodiment of the present invention, in successive steps for illustrating a method for producing the device.

First of all, a semi-insulating semiconductor substrate body 21 is made ready for use, similarly to the Embodiment 1 (FIG. 11A).

Figure 11B:
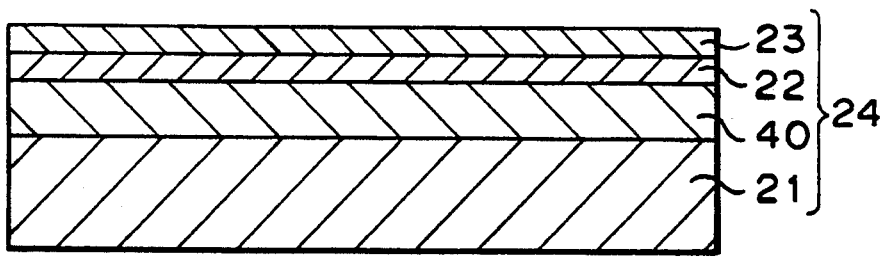

On the semi-insulating semiconductor substrate body 21 are successively formed by the epitaxial growth technique a semi-insulating semiconductor layer 40 comprising a second III-V compound semiconductor (e.g. GaAs), a semi-insulating barrier layer (InGaP layer) 22, and a semi-insulating cap layer 23 comprising a semiconductor (e.g. GaAs) with a narrower energy bandgap than that of the InGaP constituting the semi-insulating barrier layer 22 and having a thickness of, say, 100 Å. A semiconductor substrate 24 is thus obtained which has a structure comprising the semi-insulating semiconductor layer 40, the semi-insulating barrier layer 22 and the semi-insulating cap layer 23 laid in this order on the semi-insulating semiconductor substrate body 21 (FIG. 11B).

Figure 11C:
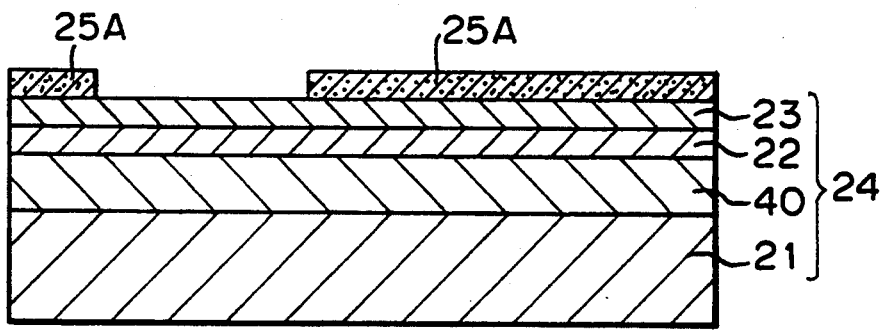

On the semiconductor substrate 24 is formed a first mask layer 25A with a first desired pattern by various methods known per se (FIG. 11C).

Figure 11D:
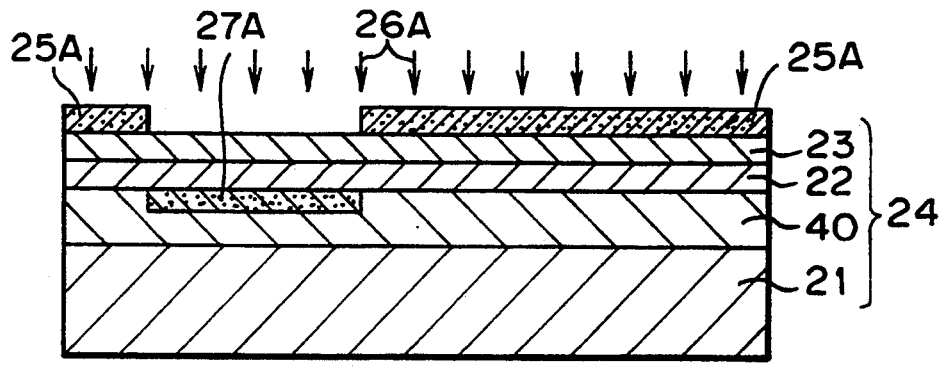

Then, ions 26A of, say, Si as n type impurities are implanted into the semiconductor substrate 24 from the semi-insulating barrier layer 22 side, with the semiconductor substrate 24 being masked by the first mask layer 25A, in an implantation amount of, say, $1.5 \times 10^{13}/cm^2$ at an acceleration energy of, say, 25 keV, whereby a first n type impurity ion implanted region 27A is formed which occupies the semi-insulating semiconductor layer 40 of the semiconductor substrate 24 to a desired depth from the semi-insulating barrier layer 22 side toward the semi-insulating semiconductor substrate body 21 side (FIG. 11D).

Figure 11E:
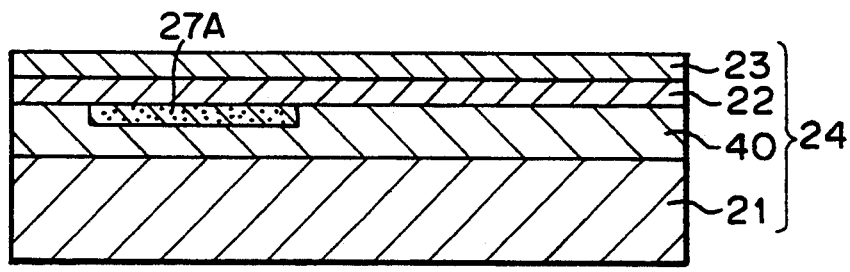

Thereafter, the first mask layer 25A is removed from above the semiconductor substrate 24 by various methods known per se (FIG. 11E).

Figure 11F:
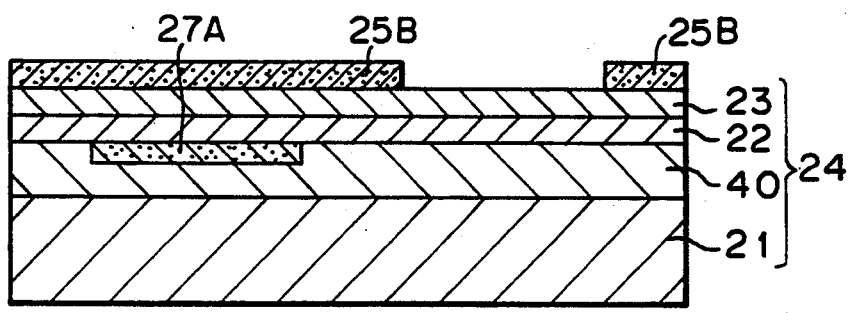

Then, a second mask layer 25B with a desired second pattern is formed by various methods known per se on the semiconductor substrate 24 at different positions from those above the first n type impurity ion implanted region 27A (FIG. 11F).

Figure 11G:
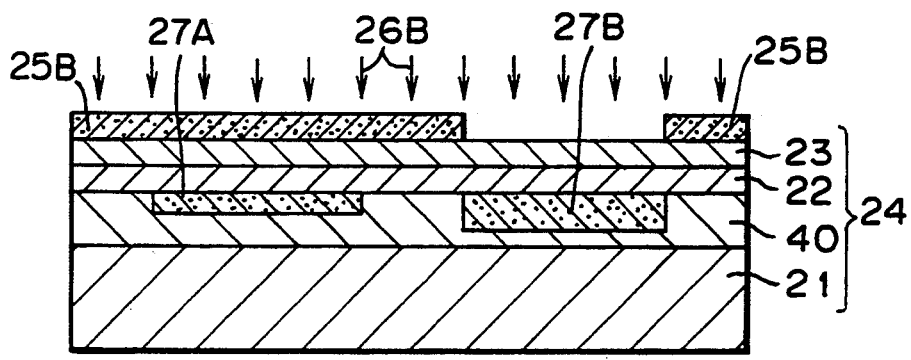

Then, ions 26B of, say, Si as n type impurities are implanted into the semiconductor substrate 24 from the semi-insulating barrier layer 22 side, with the semiconductor substrate 24 being masked by the second mask layer 25B, in the same implantation amount of, say, $1.5 \times 10^{15}/cm^2$ as for the ions 26A at a higher acceleration energy of, say, 30 keV than for the ions 26A, whereby a second n type impurity ion implanted region 27B is formed which occupies the semi-insulating semiconductor layer 40 of the semiconductor substrate 24 to a larger desired depth than the first n type impurity ion implanted region 27A from the semi-insulating barrier layer 22 side toward the semi-insulating semiconductor substrate body 21 side (FIG. 11G).

Figure 11H:
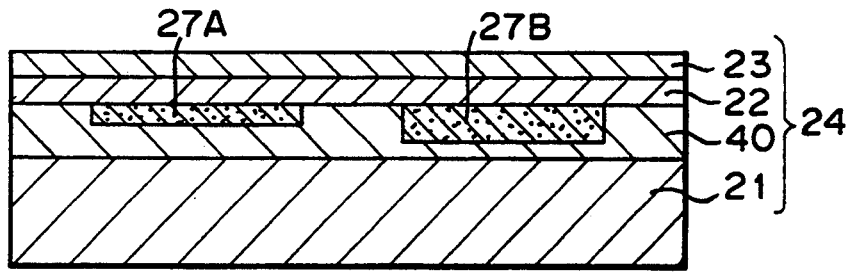

Thereafter, the second mask layer 25B is removed from above the semiconductor substrate 24 by various methods known per se FIG. 11H).

Figure 11I:
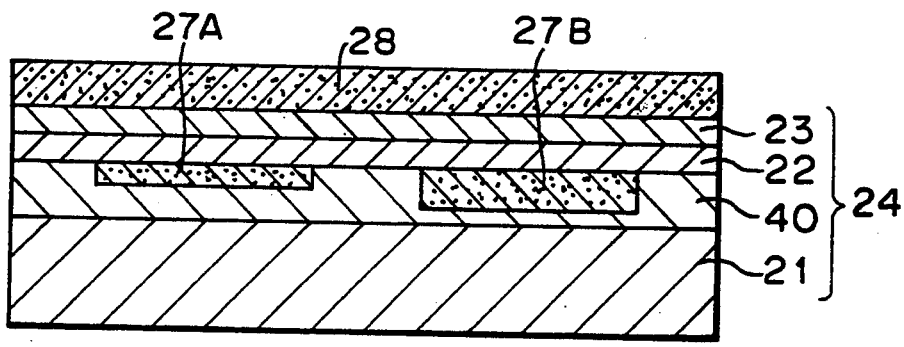

Then, an annealing cap film 28 comprising, say, SiN and having a thickness of, say, 1500 Å is formed on the semiconductor substrate 24 by various methods known per se (FIG. 11I).

Figure 11J:
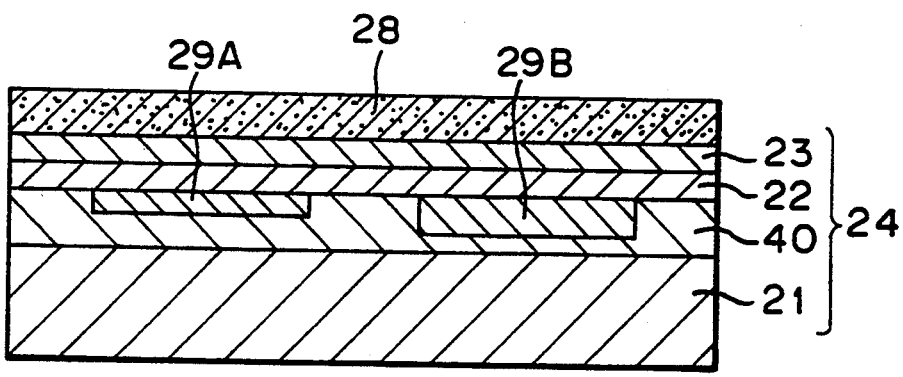

Next, the semiconductor substrate 24 is annealed for 10 minutes at a temperature of, say, 800° C. to activate the first and second n type impurity ion implanted regions 27A and 27B and form a first n type semiconductor region 29A for a first active layer from the first n type impurity ion implanted region 27A and form a second n type semiconductor region 29B for a second active layer from the second n type impurity ion implanted region 27B in areas created by occupying the semi-insulating semiconductor layer 40 of the semiconductor substrate 24 to a desired depth from the semi-insulating barrier layer 22 side toward the semi-insulating semiconductor substrate body 21 side (FIG. 11J).

Figure 11K:
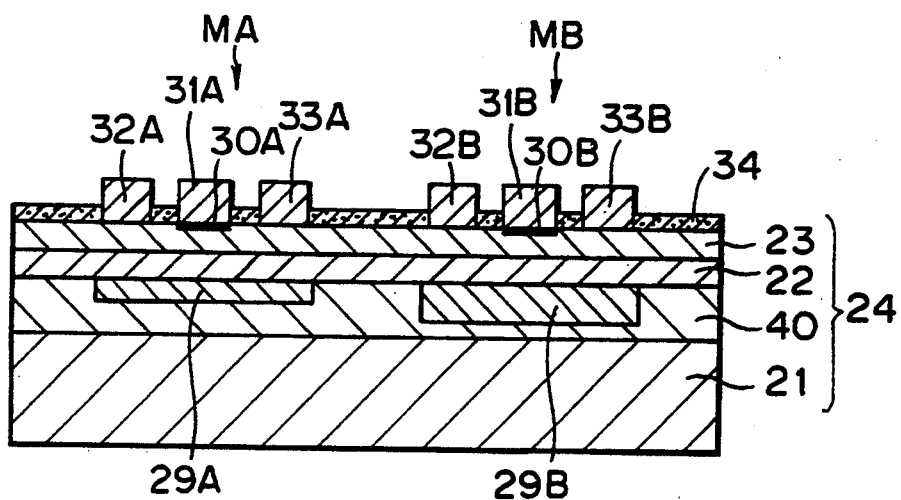

After the annealing cap film 28 on the semiconductor substrate 24 is removed, there are formed first and second gate electrodes 31A and 31B comprising, say, WSiN which form Schottky junctions 30A and 30B, respectively, with the semi-insulating cap layer 23, above the first and second n type semiconductor regions 29A and 29B for active layers. There are also formed a first source electrode 32A and a first drain electrode 33A which are connected in an ohmic manner to the first n type semiconductor region 29A for an active layer through the semi-insulating cap layer 23 and the semi-insulating barrier layer 22 at both opposite positions across the first gate electrode 31A, and a second source electrode 32B and a second drain electrode 33B which are connected in an ohmic manner to the second n type semiconductor region 29B for an active layer through the semi-insulating cap layer 23 and the semi-insulating barrier layer 22 at both opposite positions across the second gate electrode 31B. These electrodes are formed on the semiconductor substrate 24 by various methods known per se (FIG. 11K). Reference numeral 34 in FIG. 11K refers a protective layer of insulating material which is formed on the semiconductor substrate 24 for forming the gate electrodes 31A, 31B, the source electrodes 32A, 32B, and the drain electrodes 33A, 33B.

The ohmic junctions between the source electrode 32A, 32B or the drain electrode 33A, 33B and the n type semiconductor region 29A, 29B are provided as follows. After the metal electrodes are deposited, the semiconductor substrate 24 is annealed at a lower temperature of, say, 350° C.–400° C. to diffuse the metal to the semiconductor region 29A, 29B. Thus diffusion regions of the metal become alloyed state to connect the electrodes to n type semiconductor region 29A, 29B ohmicly.

The foregoing is a description of the second embodiment of the present invention.

The semiconductor circuit device obtained by the instant second embodiment (FIG. 11K) clearly has a first transistor MA comprising the first n type semiconductor region 29A for an active layer, the first gate electrode 31A, the first source electrode 32A, and the first drain electrode 33A, and a second transistor MB comprising the second n type semiconductor region 29B for an active layer, the second gate electrode 31B, the second source electrode 32B, and the second drain electrode 33B, and having different characteristics from those of the first transistor MA. According to the production method shown in the instant second embodiment, therefore, semiconductor circuit device can be produced easily as one having the first and second transistors MA and MB with different characteristics from each other.

In the semiconductor circuit device produced by the manufacturing method shown in the instant second embodiment, the first and second transistors MA and MB have a construction in which the first and second n type semiconductor regions 29A and 29B for active layers are formed within the semi-insulating semiconductor layer 40 formed on the semi-insulating semiconductor substrate body 21. In this case, the semi-insulating semiconductor layer 40 can be easily formed as one containing undesirable impurities in much smaller amounts than in the semi-insulating semiconductor substrate, body 21, and the semi-insulating semiconductor layer 40 can be formed of a different material from that of the semi-insulating semiconductor substrate body 21. According to the instant method, therefore, a semiconductor circuit device can be produced easily as one having the first and second transistors MA and MB with excellent characteristics which are different from those obtained when the first and second n type semiconductor regions 29A and 29B for active layers are formed within the semi-insulating semiconductor substrate body 21.

In the semiconductor circuit device obtained by the instant method, moreover, the first and second transistors MA and MB have a structure in which the first and second n type semiconductor regions 29A and 29B as the active layers do not form the surface of the semiconductor substrate 24, and the semi-insulating barrier layer 22 is interposed between each of the first and second n type semiconductor regions 29A and 29B for the active layers and the surface of the semiconductor substrate 24. Therefore, even if a defect layer is formed on the surface of the semiconductor substrate 24 during or after the production of the semiconductor circuit device, the layer becoming a barrier against the migration of electrons in the first and second n type semiconductor regions 29A and 29B for the active layers into the defect layer is present between each of the first and second n type semiconductor regions 29A and 29B for the active layers and the defect layer. Hence, electrons in the first and second n type semiconductor regions 29A and 29B for the active layers minimally reach the defect layer on the surface of the semiconductor substrate 24, thus effectively preventing the generation of noises due to the defect layer during the operation of the first and second transistors MA and MB.

In the present device, furthermore, the first and second transistors MA and MB have a structure in which the first and second gate electrodes 31A and 31B are formed on the semiconductor substrate 24 so as to form the first and second Schottky junctions 30A and 30B with the semi-insulating cap layer 23. Therefore, the Schottky junctions 30A and 30B provided between each of the first and second gate electrodes 31A and 31B and the semi-insulating cap layer 23 constitute a barrier against electrons when the first and second n type semiconductor regions 29A and 29B side as the active layers is viewed from the first and second gate electrodes 31A and 31B side. Since the semi-insulating barrier layer 22 against electrons is present, the height of the barrier by the Schottky junctions 30A and 30B when the first and second n type semiconductor regions 29A and 29B side as the active layers is viewed from the first and second gate electrodes 31A and 31B side becomes larger than in the absence of the semi-insulating barrier layer 22. Hence, when the first and second transistors MA and MB are used as binary logic circuit elements (on-off elements), logic amplitude can be made larger than in the absence of the semi-insulating barrier layer 22, thus increasing the operation margin of the binary logic circuit elements.

In the semiconductor circuit device produced by the method for producing the device according to the present invention shown in the instant second embodiment, the first and second transistors MA and MB are constructed such that the first and second gate electrodes 31A and 31B are connected to the semi-insulating cap layer 23 so as to form first and second Schottky junctions 30A and 30B, respectively. Assume, in this case, that each of the first and second gate electrodes 31A and 31B and the semi-insulating cap layer 23 are constructed of materials using elements which avoid the situation that when a relatively high heat is given to the first and second Schottky junction field-effect transistors MA and MB, a reaction easily takes place between the element of the material constituting the first and second gate electrodes 31A and 31B and the element of the material constituting the semi-insulating cap layer 23. By so doing, any damage to the Schottky junctions can be prevented. In other words, the first and second gate electrodes 31A and 31B are constructed of a material comprising, say, WSiN as stated above, while the semi-insulating cap layer 23 is constructed of a material comprising, say, GaAs as stated above. Under this situation, when a relatively high heat, say, of 800° C. or higher is given to the first and second transistors MA and MB, a reaction between the element of the material making up the first and second gate electrodes 31A and 31B (e.g. WSiN) and the element of the material making up the semi-insulating cap layer 23 (e.g. GaAs) can be prevented effectively. Also, assume that the thickness of the semi-insulating cap layer 23 is kept within a range in which the operation margin of the binary logic circuit element can be increased as mentioned above, namely, that the semi-insulating cap layer 23 composed of, say, GaAs is adjusted to a thickness of 50–250 Å. Under this situation, a similar problem that may occur between each of the first and second gate electrodes 31A and 31B and the semi-insulating barrier layer 22 can be avoided. That is, even if the first and second gate electrodes 31A and 31B are composed of a material such as WSiN which is apt to react easily with the semi-insulating barrier layer 22 made of InGaP, and even if a relatively high heat, say, of 800° C. or higher is given to the first and second transistors MA and MB, a reaction between the element constituting the material of the first and second gate electrodes 31A and 31B, especially W, and the element constituting the material of the semi-insulating barrier layer 22, especially In, can be prevented effectively, and the deterioration of the Schottky junctions can also be prevented.

Hence, according to the method for producing the device of the present invention illustrated in the instant second embodiment, a semiconductor circuit device can be produced easily as one having first and second transistors MA and MB functioning with desired characteristics even if they undergo a relatively high heat.

Embodiment 3

Next, a third embodiment of the method for producing a semiconductor circuit device according to the present invention will be described with reference to FIGS. 12A to 12K.

In FIGS. 12A to 12K, the same parts as illustrated in the above Embodiments 1 and 2 will be indicated by the same reference numerals, and a detailed explanation for them will be omitted.

The method for producing a semiconductor circuit device according to the present invention as shown in FIGS. 12A to 12K comprises the below-described successive steps.

Figure 12A:
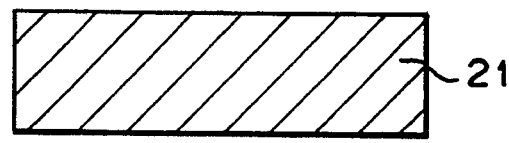
FIGS. 12A to 12K are each a cross sectional view showing a semiconductor circuit device produced according to a third embodiment of the present invention, in successive steps for illustrating a method for producing the device.

A semi-insulating semiconductor substrate body 21 is made ready for use, similarly to the methods for producing semiconductor integrated circuit devices shown in the Embodiments 1 and 2 (FIG. 12A).

Figure 12B:
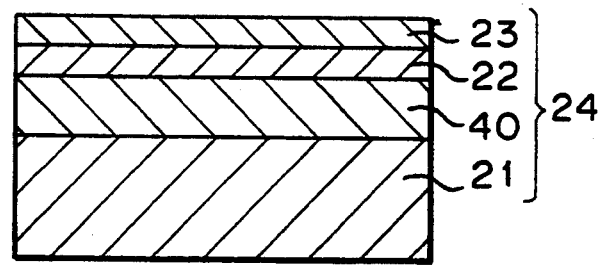

On the semi-insulating semiconductor substrate body 21 are successively formed by the epitaxial growth technique a semi-insulating semiconductor layer 40, a semi-insulating barrier layer 22, and a semi-insulating cap layer 23 comprising, say, GaAs as a semiconductor with a narrower energy bandgap than that of the InGaP constituting the semi-insulating barrier layer 22 and having a thickness of, say, 100 Å. They are formed in the same manner as in the methods for producing semiconductor circuit devices shown in the Embodiments 1 and 2. A semiconductor substrate, 24 is thus obtained which has a structure comprising the semi-insulating semiconductor layer 40, the semi-insulating barrier layer 22 and the semi-insulating cap layer 23 laid in this order on the semi-insulating semiconductor substrate body 21 (FIG. 12B).

Figure 12C:
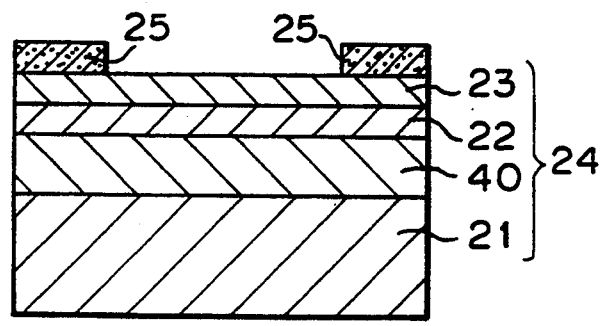

On the semiconductor substrate 24 is formed a first mask layer 25 in the same manner as in the methods for producing semiconductor integrated circuit devices shown in the Embodiments 1 and 2 (FIG. 12C).

Figure 12D:
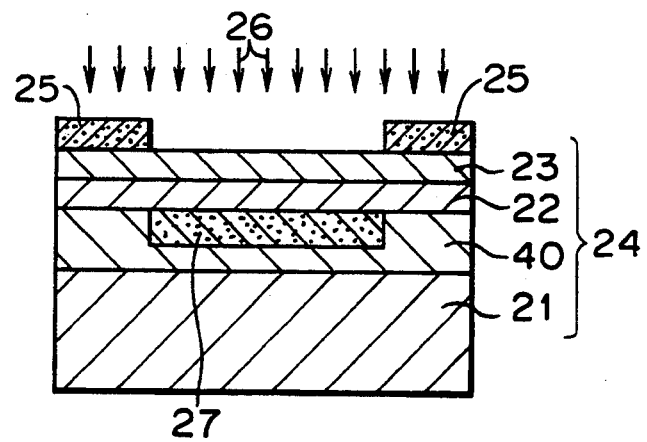

Then, n type impurity ions 26 are implanted into the semiconductor substrate 24, with the semiconductor substrate 24 being masked by the first mask layer 25, in the same manner as in the aforementioned manufacturing method, whereby a first n type impurity ion implanted region 27 is formed within the semiconductor substrate 24 (FIG. 12D).

Figure 12E:
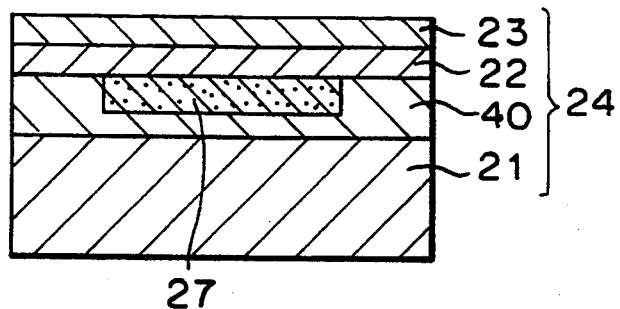

Thereafter, the first mask layer 25 is removed from above the semiconductor substrate 24 (FIG. 12E).

Figure 12F:
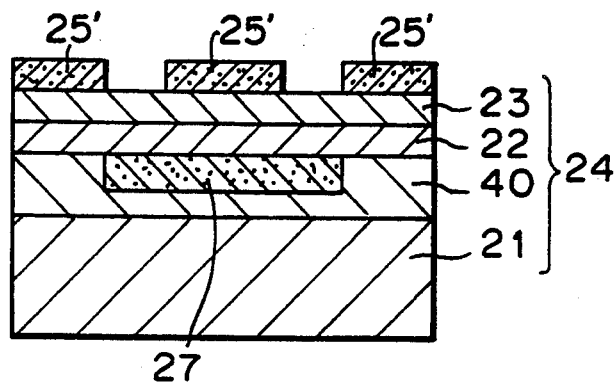

Then, a second mask layer 25' is formed on the semiconductor substrate 24 (FIG. 12F).

Figure 12G:
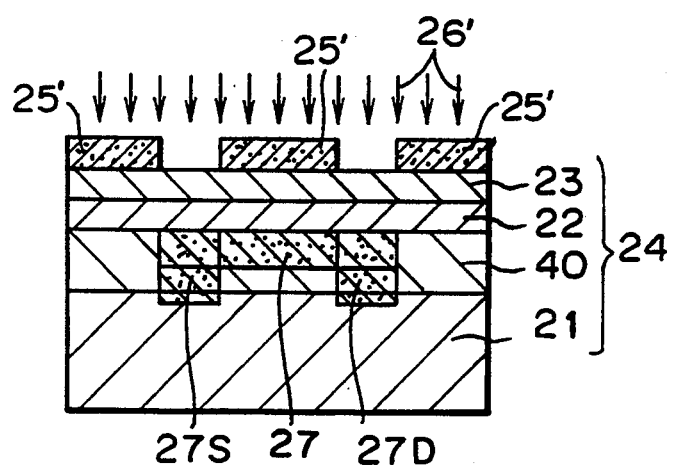

Then, n type impurity ions 26' are implanted into the semiconductor substrate 24, with the semiconductor substrate 24 being masked by the second mask layer 25', whereby second and third n type impurity ion implanted regions 27S and 27D are formed within the semiconductor substrate 24 (FIG. 12G).

Figure 12H:
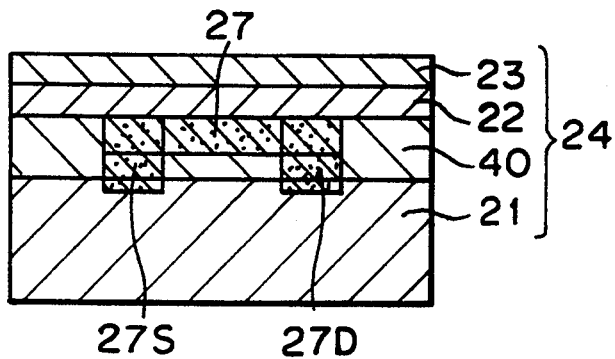

Thereafter, the second mask layer 25' is removed from above the semiconductor substrate 24 (FIG. 12H).

Figure 12I:
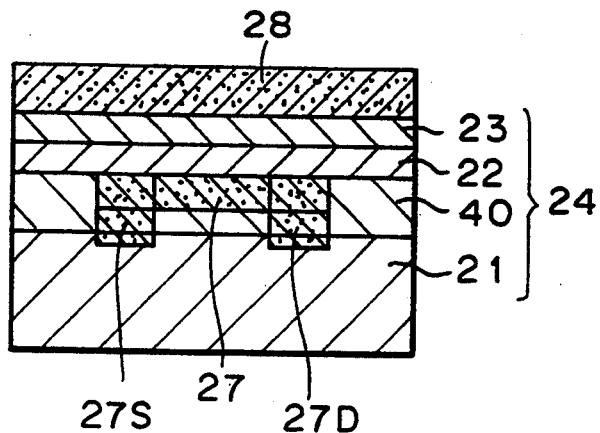

Then, an annealing cap film 28 is formed on the semiconductor substrate 24 (FIG. 12I).

Figure 12J:
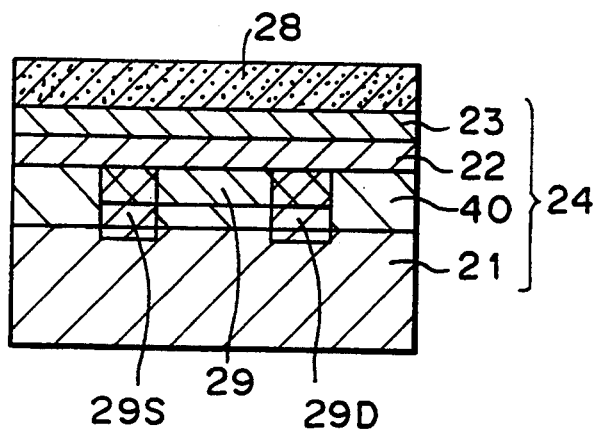

Next, the semiconductor substrate 24 is annealed to form an n type semiconductor region 29 for an active layer, an n type semiconductor region 29S for a source electrode region, and an n type semiconductor region 29D for a drain electrode region (FIG. 12J).

Figure 12K:
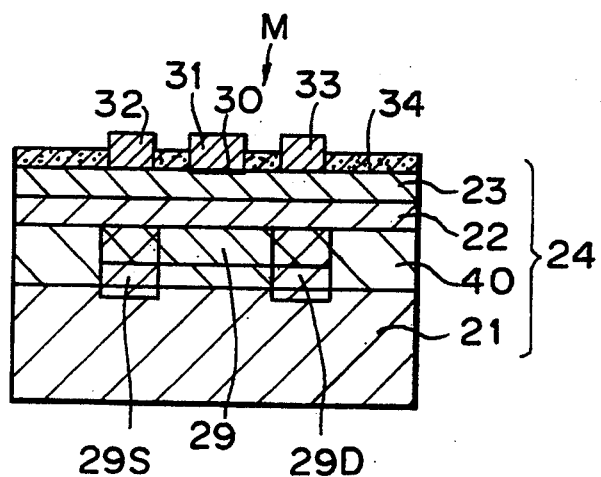

After the annealing cap film 28 on the semiconductor substrate 24 is removed, there are formed on the semiconductor substrate 24 a gate electrode 31 comprising, say, WSiN which is connected to the semi-insulating cap layer 23 so as to form a Schottky junction 30 above the n type semiconductor region 29 for the active layer, as well as a source electrode 32 and a drain electrode 33 which are connected in an ohmic manner to the n type semiconductor region 29S for the source electrode region and the n type semiconductor region 29D for the drain electrode region, respectively, through the semi-insulating cap layer 23 and the semi-insulating barrier layer 22 (FIG. 12K). Reference numeral 34 in FIG. 12K refers a protective layer of insulating material which is formed on the semiconductor substrate 24 for forming the gate electrode 31, the source electrode 32, and the drain electrode 33.

The ohmic junction between the source electrode 32 or the drain electrode 33 and the n type semiconductor region 29S, 29D are provided as follows. After the metal electrodes are deposited, the semiconductor substrate 24 is annealed at a lower temperature of, say, 350° C.–400° C. to diffuse the metal to the semiconductor region 29S, 29D. Thus diffusion regions of the metal become alloyed state to connect the electrodes to n type semiconductor region 29S, 29D ohmicly.

The foregoing is a description of the third embodiment of the method for producing a semiconductor integrated circuit device according to the present invention. This third embodiment also clearly exhibits the same actions and effects as obtained in the Embodiments 1 and 2.

Embodiment 4

A fourth embodiment of the present invention will be described with reference to FIGS. 13A to 13K, in which the same parts as illustrated in the above Embodiments 1 through 3 will be indicated by the same reference numerals for a simplified explanation.

Figure 13A:
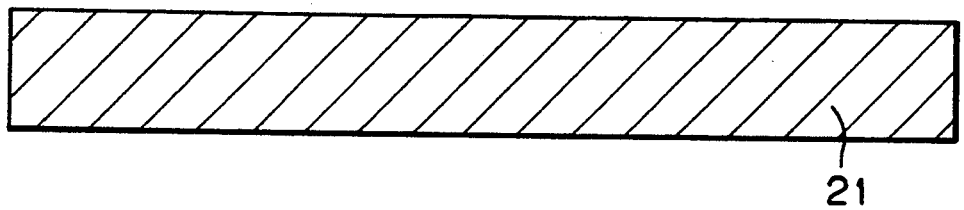
FIGS. 13A to 13K are each a cross sectional view showing a semiconductor circuit device produced according to a third embodiment of the present invention, in successive steps for illustrating a method for producing the device.

A GaAs substrate is prepared as a semi-insulating semiconductor substrate body 21 (FIG. 13A).

Figure 13B:
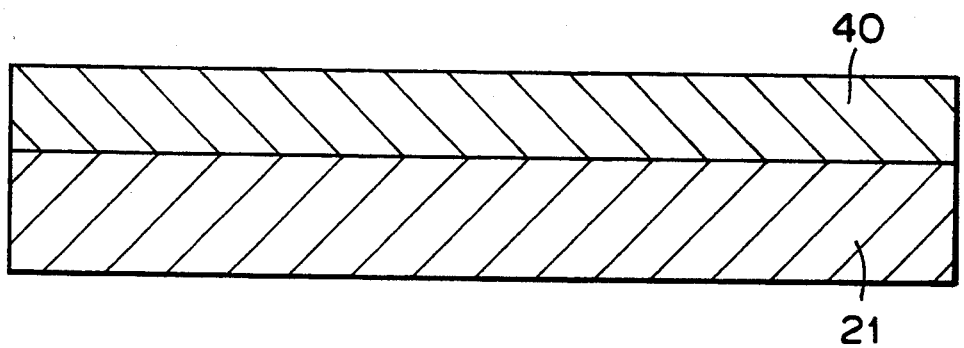

Then, a 1,000 Å GaAs semi-insulating semiconductor layer 40 is epitaxially grown by, say, the MOCVD process on the substrate body 21 (FIG. 13B).

Figure 13C:
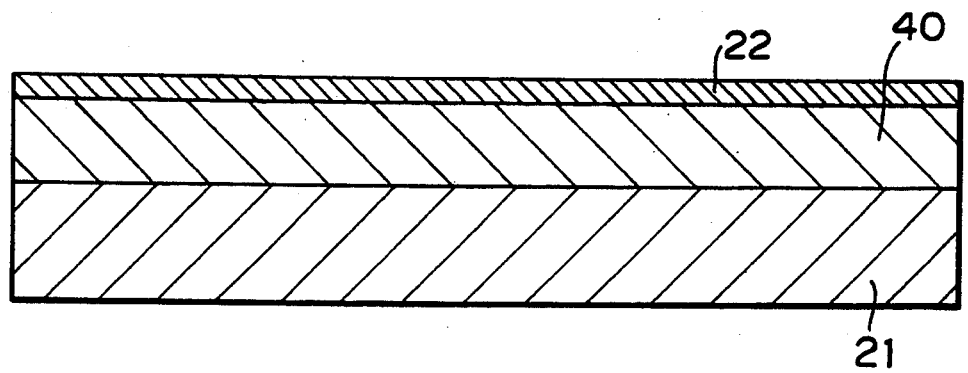

A 100 Å InGaP semi-insulating barrier layer 22 is epitaxially grown on the semiconductor layer 40 by, say, the MOCVD process (FIG. 13C).

Figure 13D:
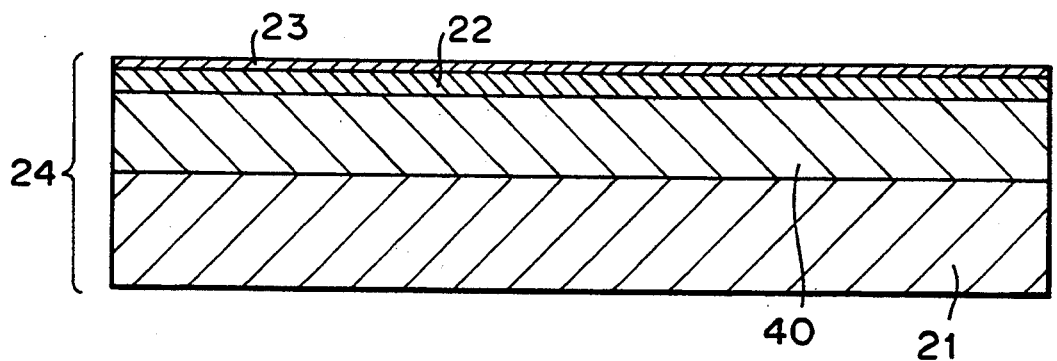

A 75 Å semi-insulating cap layer 23 is grown on the barrier layer 22 by, say, the MOCVD process. Importantly, the cap layer 23 is composed of an In-free semiconductor crystal. In this embodiment, GaAs is used (FIG. 13D).

Figure 13E:
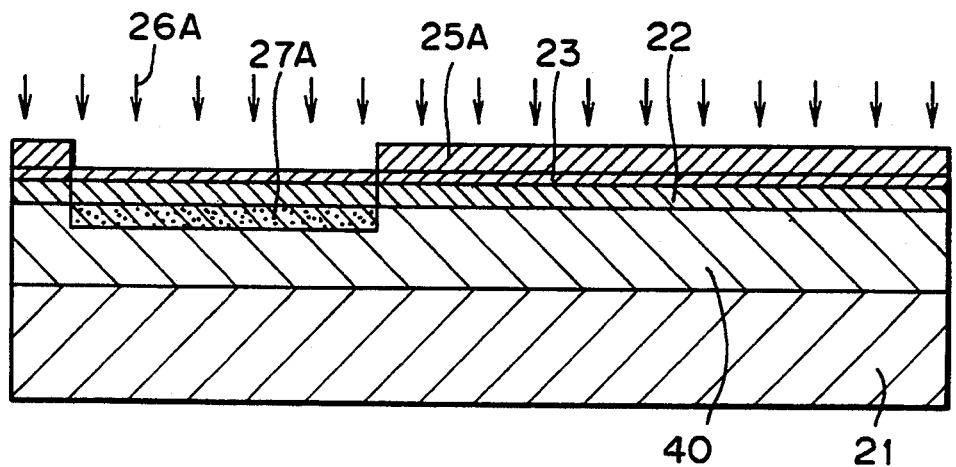

On the so prepared substrate 24 is formed a patterned mask layer (photoresist) 25A. With the resulting mask layer 25A used as a mask, n type impurity ions 26A, say, Si ions are implanted, say, at an acceleration energy of 30 keV and a dose of $2.5 \times 10^{12}/cm^2$, to form an ion implanted region 27A (FIG. 13E).

Figure 13F:
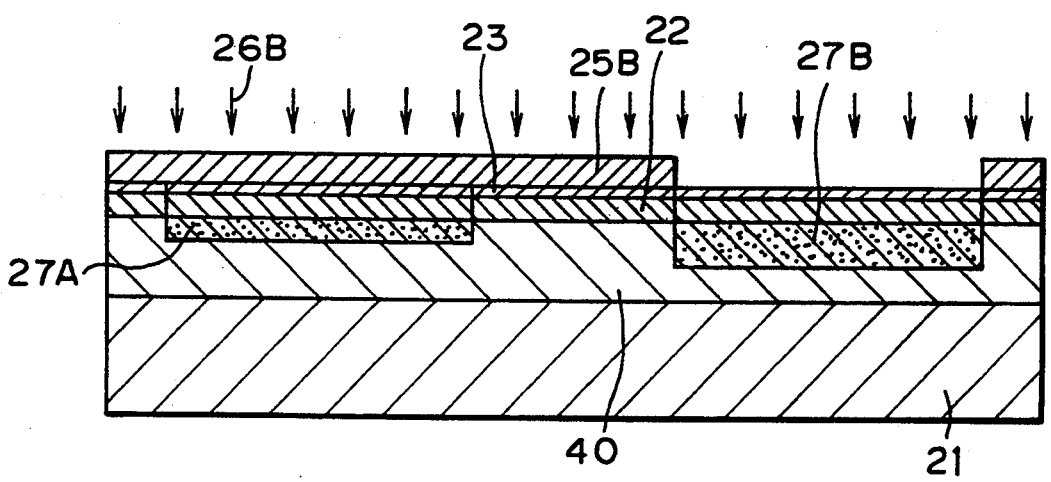

After the mask layer 25A is removed, a patterned mask layer 25B is formed on the substrate 24. With the resulting mask layer 25B used as a mask, n type impurity ions 26B, say, Si ions are implanted, say, at an acceleration energy of 40 keV and a dose of $2.5 \times 10^{12}/cm^2$, to form an ion implanted region 27B (FIG. 13F).

Figure 13G:
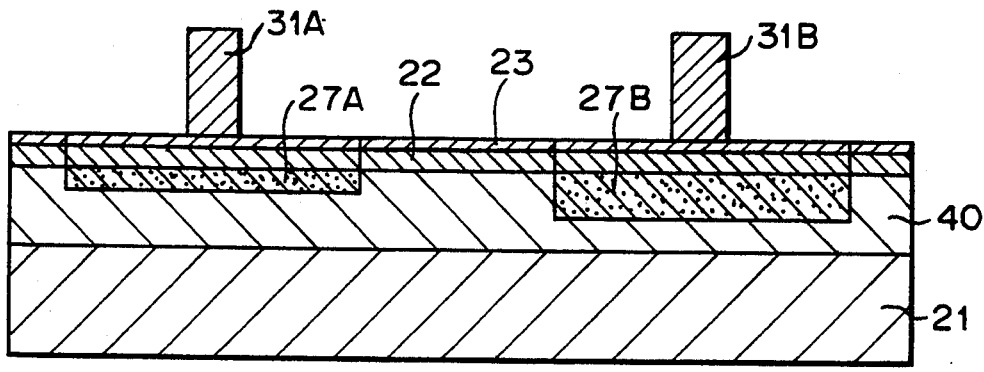

After the mask layer 25B is removed, gate electrodes 31A, 31B are formed on the ion implanted regions 27A, 27B by use of a refractory metal, WSiN, to construct Schottky junctions (FIG. 13G).

Figure 13H:
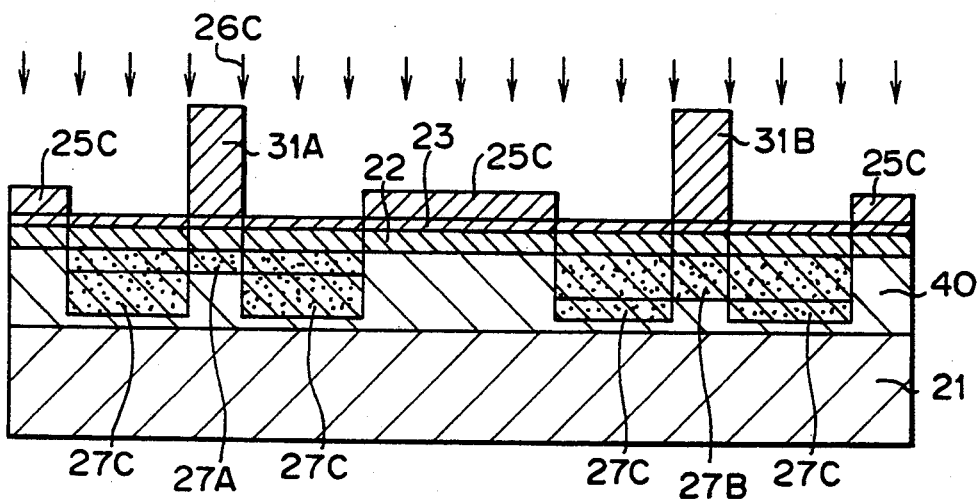

Then, a patterned mask layer 25C is formed. With this layer and the gate electrodes 31A, 31B used as masks, n type impurity ions 26C, say, Si ions are implanted, say, at an acceleration energy of 80 keV and a dose of $5 \times 10^{13}/cm^2$, to form an ion implanted region 27C. That is, the ion implanted region 27C is formed on both sides of the gate electrodes 31A, 31B in a self-aligned manner (FIG. 13H).

Figure 13I:
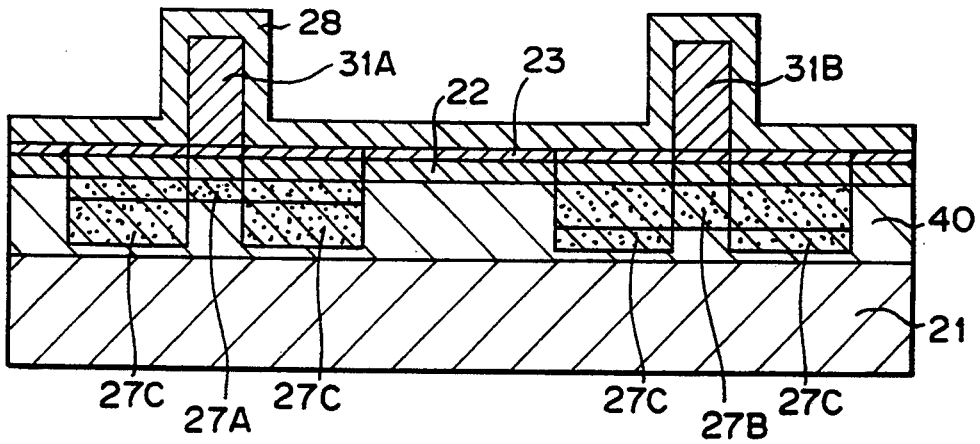

After the mask layer 25C is removed, a 1,000 Å SiO$_2$ film is deposited as an annealing cap film 28. To activate the implanted ions, the substrate is annealed, say, at 950° C. for one second (FIG. 13I).

Figure 13J:
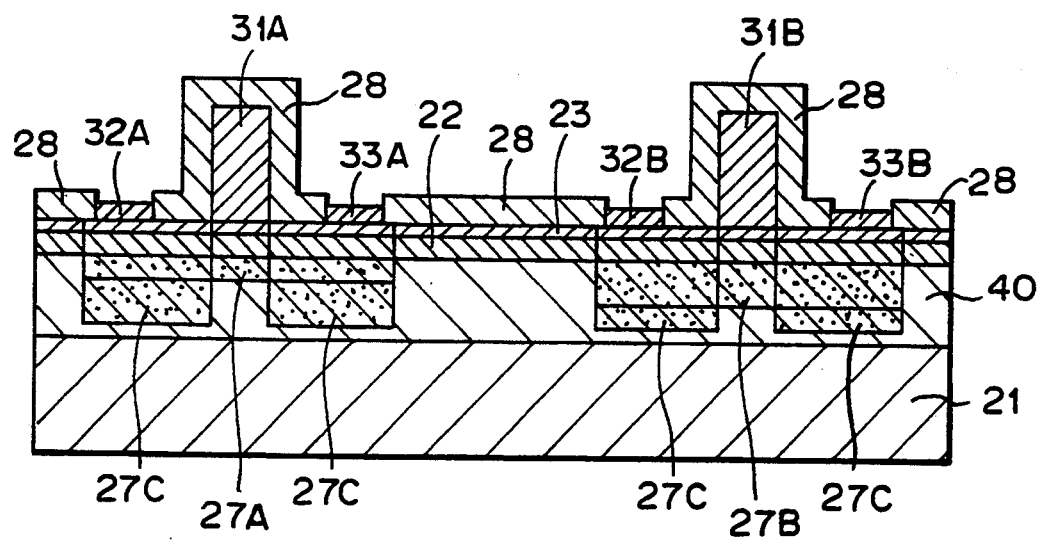

Then, those portions of the annealing cap film 28 positioned on both sides of the gate electrodes 31A, 31B are opened to form source electrodes 32A, 32B and drain electrodes 33A, 33B. These electrodes are connected to the n type ion implanted region 27C through the cap layer 23 and the barrier layer 22 in an ohmic manner. If, here, a conductive film of, say, WSiN is used as the annealing cap film 28, the first task to do is to remove this conductive film. Then, an insulating film, say, of SiO$_2$ is deposited, and with this film being regarded as the annealing cap film 28, a subsequent step is carried out (FIG. 13J).

Figure 13K:
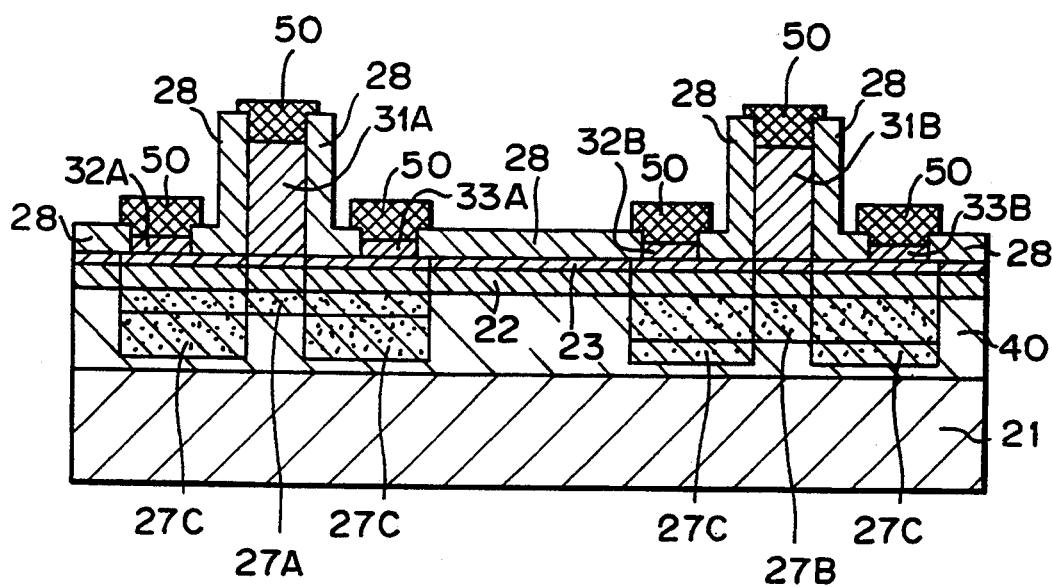

Finally, those portions of the annealing cap film 28 where the gate electrodes 31A, 31B are present are also opened. To each electrode is connected a wiring metal 50 to obtain a semiconductor device (FIG. 13K).

The foregoing is the fourth embodiment of the present invention. It is clear that this embodiment also gives the same actions and effects as do the aforementioned embodiments.

The difference between the present embodiment and each of the aforesaid embodiments is that the gate electrode made of a refractory metal is used as a mask for forming the impurity ion implanted region below each ohmic electrode. By this use, the instant embodiment makes the steps for semiconductor production more efficient. In this embodiment, as aforementioned, after the formation of the gate electrodes, annealing is performed to activate the impurity ion implanted regions. Therefore, more care is required than in the aforementioned conventional embodiment concerning the reaction of the gate electrodes 31A, 31B with the cap layer 23, and further with the InGaP barrier layer 22 which may easily react with the metal. As aforementioned, however, the cap layer 23 is composed of an In-free semiconductor crystal and can be formed so as to have a sufficient thickness. Therefore, the problem that the In in the barrier layer 22 and the W in the gate electrodes 31A, 31B react to deteriorate the Schottky junctions of the gate electrodes does not occur.

In the semiconductor circuit device obtained in the above-mentioned embodiment, the threshold voltage of the device, $V_T$, can be approximately expressed as follows:

$$V_T = V_{bi} - (q/2\epsilon)*N*d^2$$

where $V_{bi}$ is the built-in potential of the Schottky electrode, q is charge, e is dielectric constant, N is the carrier concentration of the channel (27A, 27B), and d is the thickness of the channel (27A, 27B). As indicated in this equation, a desired threshold voltage can be achieved by changing the conditions for ion implantation and varying the carrier concentration and thickness of 27A, 27B. However, the threshold voltage refers to a gate voltage at which an electric current begins to flow, or fails to flow any longer, into the channel after a voltage is applied between the source and the drain.

As is well known, a field-effect transistor is one in which a voltage is applied to a source electrode and a drain electrode (both are ohmic electrodes) positioned on both sides of a gate electrode (Schottky electrode), and the resulting current is controlled by applying a voltage to the gate to vary the width of a depletion region below the gate. From the viewpoint of element operation, it is desired that the source and drain have no parasitic resistance. Desirably, therefore, the implanted layers of the source and drain regions are high in carrier concentration, large in thickness, and as close to the gate as possible. (Their contact to the gate region, however, would increase a leakage current from the gate.) Thus, the ion implantation of a self-alignment type shown in the step 13H of the instant embodiment can be said to be ideal for reducing the parasitic resistance.

Embodiment 5

This embodiment involves the method of the Embodiment 4 in which the semi-insulating epitaxial layer 40 is formed on the semi-insulating semiconductor substrate body 21, and then the mask layer is formed, to form the ion implanted layers 27A, 27B beforehand. Thereafter, the remaining layers can be formed in accordance with the Embodiments 3, 4; therefore, a detailed explanation for the Embodiment 5 will be omitted, and only elementary steps will be described blow.

A method for producing a semiconductor circuit device of the fifth embodiment according to the present invention comprises;

a step of forming a first patterned mask layer on a semi-insulating semiconductor substrate comprising a first III-V compound semiconductor, and implanting n-type impurity ions into the substrate through the first mask layer as a mask to form a first n type impurity ion implanted region, a step of forming a semi-insulating barrier layer comprising InGaP with a wider energy bandgap than that of the first III-V compound semiconductor on the substrate after the first mask layer is removed, a step of forming a semi-insulating cap layer comprising a semiconductor with a narrower energy bandgap than that of the InGaP and free from In as a constituent element, a step of forming a gate electrode comprising a refractory metal on the cap layer above the ion implanted region, a step of forming a second mask layer with a pattern different from that of the first mask layer on the cap layer, and implanting n type impurity ions from the cap layer side through the second mask layer and the gate electrode as masks to form a second impurity ion implanted region, a step of depositing an annealing cap film on the cap layer after the second mask layer is removed, and annealing the substrate to activate the impurity ion implanted region and convert it into an n type semiconductor region, and a step of providing openings at opposite positions, across the gate electrode, of the annealing cap film, and forming a source electrode and a drain electrode.

The aforementioned Embodiments 2, 4 have shown that two transistors with different characteristics can be produced on a single substrate. It is one of the features of the present invention that a plurality of transistors can thus be easily formed on one substrate. A concrete circuit example of such a semiconductor circuit device will be shown below.

An FET in which no current flows when the gate voltage=0 V (Low Level) is called an enhancement type FET (E-FET), while an FET in which a current flows when the gate voltage=0 V (Low Level) is called a depletion type FET (D-FET). An inverter can be achieved if these two types of FETs are combined as in FIG. 14. That is, if a Low Level voltage (usually 0 V) is applied to the In, no current flows through the E-FET, thus making the voltage to the Out a High Level (nearly $V_{DD}$). If a High Level voltage is applied to the In, a current flows through the E-FET, thus making the voltage to the Out a Low Level (nearly 0 V).

If a plurality of the E-FET portions of FIG. 14 are connected in parallel, there can be accomplished a NOR circuit in which an output voltage becomes a High Level only when all the input voltages to the E-FETs are at a Low Level; and the output voltage becomes a Low Level in other cases. FIG. 15 shows a three-input NOR circuit.

When an inverter and a NOR circuit are connected as in FIG. 16, an AND circuit can be accomplished.

That is, all logic circuits can be achieved by combining two FETs with different threshold voltages.

The present invention has been described in detail with respect to preferred embodiments, and it will now be clear that changes and modifications may be made without departing from the inventions in its broader aspects, and it is out intention, therefore, in the appended claims to cover all such changes and modifications as fall within the true spirit of the invention.

What is claimed is:

1. A semiconductor circuit device comprising
a semi-insulating semiconductor substrate comprising a first III-V compound semiconductor,
a semi-insulating barrier layer comprising InGaP with a wider energy bandgap than that of the first III-V compound semiconductor, and being formed on the semi-insulating semiconductor substrate,
an n type semiconductor region being formed in an upper portion of the semiconductor substrate in contact with the barrier layer, and having n type impurity ions doped in the semiconductor substrate,
a semi-insulating cap layer comprising a semiconductor with a narrower energy bandgap than that of the InGaP and free from In as a constituent element, and being formed on the barrier layer,
a refractory metal gate electrode being formed on the cap layer above the n type semiconductor region, and making a Schottky junction with the cap layer, and
a source electrode and a drain electrode being formed at opposite positions across the gate electrode on the cap layer above the n type semiconductor region, and being connected in an ohmic manner to the n type semiconductor region through the cap layer and the barrier layer.

2. A semiconductor circuit device as claimed in claim 1, wherein the semiconductor substrate consists of a single semi-insulating semiconductor substrate alone.

3. A semiconductor circuit device as claimed in claim 1, wherein the semiconductor substrate comprises a single semi-insulating semiconductor substrate, and a semi-insulating semiconductor layer formed thereon by epitaxial growth and comprising a III-V compound semiconductor.

4. A semiconductor circuit device as claimed in claim 1, wherein in the n type semiconductor region, an impurity ion concentration is higher in the region situated below the source electrode and the drain electrode than in the region situated below the gate electrode.

5. A semiconductor circuit device as claimed in claim 1, wherein in the n type semiconductor region, the thickness of the region situated below the gate electrode is smaller than the thicknesses of the regions situated below the source electrode and the drain electrode.

6. A semiconductor circuit device as claimed in claim 1, wherein the thickness of the cap layer is 250 Å or less.

7. A semiconductor circuit device as claimed in claim 1, wherein the refractory metal constituting the gate electrode is WSiN.

8. A semiconductor circuit device as claimed in claim 1, wherein a plurality of the n type semiconductor regions, the gate electrodes, the source electrodes and the drain electrodes are provided on the single substrate.

* * * * *